(12) United States Patent  
Ozora et al.

(10) Patent No.: US 7,286,950 B2  
(45) Date of Patent: Oct. 23, 2007

(54) TEST APPARATUS AND TEST METHOD

(75) Inventors: Satoshi Ozora, Tokyo (JP); Tetsuro Nakagawa, Tokyo (JP); Makoto Tsunoda, Tokyo (JP); Nobumasa Takaiwa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/179,330

(22) Filed: Jul. 12, 2005

(65) Prior Publication Data

US 2006/0036389 A1     Feb. 16, 2006

Related U.S. Application Data

(63) Continuation of application No. PCT/JP2005/010829, filed on Jun. 14, 2005.

(30) Foreign Application Priority Data

| Jun. 17, 2004 | (JP) | ............................. 2004-179857 |
| Jun. 21, 2004 | (JP) | ............................. 2004-183067 |
| Jun. 29, 2004 | (JP) | ............................. 2004-192195 |
| Jul. 20, 2004 | (JP) | ............................. 2004-212234 |

(51) Int. Cl.  
*G06F 19/00* (2006.01)

(52) U.S. Cl. ...................... 702/108; 714/724

(58) Field of Classification Search .................. 702/58, 702/59, 108, 117, 118, 119, 123, 124, 125, 702/126, 185, 189, 193; 714/25, 30, 724, 714/726, 736, 738, 742

See application file for complete search history.

(56) References Cited

U.S. PATENT DOCUMENTS 6,021,515 A  * 2/2000 Shimura ...................... 714/738

6,182,255 B1 * 1/2001 Ohtomo ...................... 714/724  
2002/0073373 A1 * 6/2002 Nakao et al. ............... 714/738

FOREIGN PATENT DOCUMENTS

| JP | 11-248804 | 9/1999 |
| JP | 2002-139557 | 5/2002 |

OTHER PUBLICATIONS

International Search Report for International Application No. PCT/JP2005/010829 mailed on Aug. 30, 2005, 2 pages.

* cited by examiner

*Primary Examiner*—Eliseo Ramos-Feliciano  
*Assistant Examiner*—Mohamed Charioui  
(74) *Attorney, Agent, or Firm*—Osha Liang LLP

(57) ABSTRACT

There is provided a testing device including: a first signal comparator operable to acquire a value of an output pattern based on a result that is obtained by comparing a voltage of an output signal and a first threshold value voltage in a first strobe timing, in order to acquire a first output pattern sequence; a second signal comparator operable to acquire a value of an output pattern based on a result that is obtained by comparing a voltage of an output signal and a second threshold value voltage in a second strobe timing, in order to acquire a second output pattern sequence; a header pattern sequence detecting unit operable to detect that the first output pattern sequence is identical with a header pattern sequence; and an expectation comparing unit operable to output a comparison result between the second output pattern sequence acquired by the second signal comparator and an expectation pattern sequence when detecting a correspondence between the first output pattern sequence and the header pattern sequence.

24 Claims, 17 Drawing Sheets

| COMMAND | OUTPUT PATTERN |
|---|---|
| ⋮ | ⋮ |
| PKTST | $D_0$ |
| NOP | $D_1$ |
| ⋮ | ⋮ |
| NOP | $D_n$ |
| PKTEND | $D_{n+1}$ |
| ⋮ | ⋮ |
| ⋮ | ⋮ |
| PKTST | $D_m$ |
| NOP | $D_{m+1}$ |
| ⋮ | ⋮ |
| NOP | $D_\ell$ |
| PKTEND | $D_{\ell+1}$ |
| ⋮ | ⋮ |

HEADER DETECTION INVALIDATION: PKTST through PKTEND (first block)

HUNT_ST →

HEADER DETECTION VALIDATION: PKTST through PKTEND (second block)

HUNT_END →

FIG. 16

| COMMAND | OUTPUT PATTERN |
|---|---|
| ⋮ | ⋮ |
| PKTST | $D_0$ |
| NOP | $D_1$ |
| ⋮ | ⋮ |
| NOP | $D_n$ |
| PKTEND | $D_{n+1}$ |
| ⋮ | ⋮ |
| ⋮ | ⋮ |
| PKTST | $D_m$ |
| NOP | $D_{m+1}$ |
| ⋮ | ⋮ |
| ⋮ | ⋮ |
| PKTEND | $D_\ell$ |
| NOP | $D_{\ell+1}$ |
| ⋮ | ⋮ |

HEADER DETECTION INVALIDATION

CPEW_ST →
CPEW_END →

HEADER DETECTION VALIDATION

FIG. 17

TEST APPARATUS AND TEST METHOD

CROSS REFERENCE TO THE RELATED APPLICATION

The present application is a continuation application of PCT/JP2005/010829 filed on Jun. 14, 2005, which claims priority from Japanese Patent applications 2004-179857 filed on Jun. 17, 2004, 2004-192195 filed on Jun. 29, 2004, 2004-183067 filed on Jun. 21, 2004, and 2004-212234 filed on Jul. 20, 2004, the entire contents of which are incorporated herein by reference for all purposes.

BACKGROUND OF THE INVENTION

1. Field of the Invention

The present invention relates to a testing device and a testing method deciding the good or bad of an electronic device by comparing an output pattern of a signal output from the electronic device and a predetermined expectation pattern.

2. Description of Related Art

A testing device tests a device under test (DUT) that is an object of test based on a test program. The test program includes commands to be executed by the testing device and an expectation pattern to be compared with a test pattern output to each terminal of the device under test or an output pattern output from each terminal of the device under test, for each command cycle. Then, the testing device sequentially reads and executes the commands of the test program from a memory. The testing device reads the test pattern corresponding to each command from the memory, and outputs to each terminal of the device under test. As a result, the output pattern is compared with a predetermined expectation pattern to be output by the device under test.

There is known a test checking a margin of the output signal from the device under test as an embodiment of a test of the device under test. In such a test, the testing device operates the device under test while changing a parameter such as the timing in which the testing device receives the output signal from the device under test and a threshold value voltage to be used for an acquisition of the output signal, and records a pass or a fail for the test performed by each parameter value. Then, assuming that each parameter is an axis of coordinate, there is made a chart in which the passes and the fails for the test using that parameter value are plotted on the coordinate. Such a chart is referred to as Shmoo plotting.

Now, since a related patent document is not recognized, the description is omitted.

Some devices under test may have the number of cycles, which is not specified or defined, from the input of a test pattern to the output of an output pattern corresponding to the test pattern. When comparing the output pattern output from such a device under test with the expectation pattern, it is desirable that the testing device has a function (a hunting function) detecting that the device under test outputs a predetermined header pattern and comparing the output pattern of the comparison object output after a particular cycle from the header pattern with the expectation pattern.

Here, considering that the Shmoo plotting is made using the testing device having the hunting function, it is necessary to change a parameter such as the acquisition timing and the threshold value voltage when the testing device acquires the output pattern of the comparison object. However, when changing these parameters, the head pattern cannot be acquired justly, and thus it is not possible to detect match or mismatch between the output pattern and the expectation pattern.

Moreover, according to the hunting function, the timing in which an output pattern sequence is output from the device under test may be different from the timing in which an expectation pattern sequence to be compared with the output pattern sequence is read from a memory. Therefore, the expectation pattern sequence and the output pattern sequence having the different timing must be synchronized in order to compare the patterns adequately.

Moreover, some devices under test may not define the timing in which the output of the output pattern sequence is started. For this reason, there is considered a method outputting a predetermined header pattern sequence showing the top of the output pattern sequence to the device under test. That is to say, according to this method, when detecting the header pattern sequence, the testing device compares an output pattern sequence output following the header pattern with the expectation pattern sequence. However, the testing device may fail in detecting the output pattern sequence identical with the header pattern sequence on account of failures of the device under test. In this case, it was difficult to analyze a cause failed in detecting the header pattern sequence conventionally.

Moreover, a conventional testing device can specify a comparison window corresponding to a range of the output pattern and the expectation pattern that are comparing objects, in order to support failure analysis of the device under test. In other words, although the output pattern and the expectation pattern are not identical with each other when the range of each pattern is outside the comparison window, the test is continued without detecting the failure. However, in case where the testing device fails in detecting the header pattern sequence outside the range of the comparison window, it may be difficult to perform failure analysis due to the mixture of unnecessary data outside the testing object range and the comparison result of the testing object when information showing the detection failure is recorded in an error log or the like or is informed a user.

SUMMARY OF THE INVENTION

Therefore, it is an object of the present invention to provide a testing device that can solve the foregoing problems. The above and other objects can be achieved by combinations described in the independent claims. The dependent claims define further advantageous and exemplary combinations of the present invention.

According to the first aspect of the present invention, there is provided a testing device that tests a margin of an output signal output from an output terminal of a device under test. The testing device includes: a first signal comparator operable to acquire a value of each of output patterns included in an output pattern sequence output from the output terminal of the device under test based on a result that is obtained by comparing a voltage of the output signal and a first predetermined threshold value voltage in a first predetermined strobe timing, in order to acquire a first output pattern sequence output from the output terminal; a second signal comparator operable to acquire a value of each of output patterns included in an output pattern sequence output from the output terminal of the device under test based on a result that is obtained by comparing a voltage of the output signal and a second predetermined threshold value voltage in a second predetermined strobe timing, in order to acquire a second output pattern sequence output from the output terminal; a header pattern sequence detecting unit operable to detect that the first output pattern sequence is identical with a predetermined header pattern sequence; and an expectation comparing unit operable to output a comparison result between the second output pattern sequence acquired by the second signal comparator and an expectation pattern sequence of the second output pattern sequence when detecting a correspondence between the first output pattern sequence and the header pattern sequence.

The testing device may further include a comparison result storing unit operable to store a comparison result between the second output pattern sequence and the expectation pattern sequence in association with the second strobe timing and the second threshold value voltage.

The testing device may further include: a test controlling unit operable to carry out more than once a test to cause the device under test to output an output pattern sequence identical with the header pattern sequence and an output pattern sequence identical with the expectation pattern sequence; and a parameter modifying unit operable to modify at least one parameter value of the second strobe timing and the second threshold value voltage in the second test into a value different from that of a parameter in the first test.

The test controlling unit may output the second strobe timing and a range of the second threshold value voltage in which the second output pattern sequence is identical with the expectation pattern sequence based on the comparison result output from the expectation comparing unit with respect to each of the plurality of tests.

At least one of the first and second strobe timings and the first and second threshold value voltages may be set to have values different from each other.

The expectation comparing unit may output a comparison result between the second output pattern sequence acquired after the first output pattern sequence is acquired and then a predetermined offset time elapses and the expectation pattern sequence when the first output pattern sequence is identical with the header pattern sequence.

The first output pattern sequence to be identical with the header pattern sequence and the second output pattern sequence to be compared with the expectation pattern sequence may be the same pattern sequences output from the output terminal of the device under test in the same timing.

According to the second aspect of the present invention, there is provided a testing device that tests a margin of an output signal output from an output terminal of a device under test. The testing device includes: a test pattern outputting unit operable to output a test pattern sequence, by which a predetermined header pattern sequence is output from the output terminal of the device under test, to the device under test; a signal comparator operable to acquire a value of each of output patterns included in an output pattern sequence output from the output terminal of the device under test based on a result that is obtained by comparing a voltage of the output signal and a threshold value voltage in a predetermined strobe timing, in order to acquire the output pattern sequence output from the output terminal; a header pattern sequence detecting unit operable to detect that the first output pattern sequence acquired by the signal comparator is identical with the header pattern sequence; a delay time acquiring unit operable to acquire a delay time from the start of the output of the test pattern to the detection of the first output pattern sequence identical with the header pattern sequence; a parameter modifying unit operable to modify at least one parameter of the strobe timing and the threshold value voltage when the delay time is acquired; a test controlling unit operable to cause the test pattern outputting unit to output the test pattern sequence once more in a state where the parameter has been modified by the parameter modifying unit; and an expectation comparing unit operable to output a comparison result between a second output pattern sequence acquired by the signal comparator after the output of the test pattern sequence is started once more and then a predetermined offset time elapses from the elapsed point of the delay time and an expectation pattern sequence of the second output pattern sequence.

According to the third aspect of the present invention, there is provided a testing method testing a margin of an output signal output from an output terminal of a device under test by means of a testing device. The testing method includes: a first signal comparing step of acquiring a value of each of output patterns included in an output pattern sequence output from the output terminal of the device under test based on a result that is obtained by comparing a voltage of the output signal and a first predetermined threshold value voltage in a first predetermined strobe timing, in order to acquire a first output pattern sequence output from the output terminal; a second signal comparing step of acquiring a value of each of output patterns included in an output pattern sequence output from the output terminal of the device under test based on a result that is obtained by comparing a voltage of the output signal and a second predetermined threshold value voltage in a second predetermined strobe timing, in order to acquire a second output pattern sequence output from the output terminal; a header pattern sequence detecting step of detecting that the first output pattern sequence is identical with a predetermined header pattern sequence; and an expectation comparing step of outputting a comparison result between the second output pattern sequence acquired in the second signal comparing step and an expectation pattern sequence of the second output pattern sequence when detecting a correspondence between the first output pattern sequence and the header pattern sequence.

According to the fourth aspect of the present invention, there is provided a testing method testing a margin of an output signal output from an output terminal of a device under test by means of a testing device. The testing method includes: a test pattern outputting step of outputting a test pattern sequence, by which a predetermined header pattern sequence is output from the output terminal of the device under test, to the device under test; a signal comparing step of acquiring a value of each of output patterns included in an output pattern sequence output from the output terminal of the device under test based on a result that is obtained by comparing a voltage of the output signal and a threshold value voltage in a predetermined strobe timing, in order to acquire the output pattern sequence output from the output terminal; a header pattern sequence detecting step of detecting that the first output pattern sequence acquired in the signal comparing step is identical with the header pattern sequence; a delay time acquiring step of acquiring a delay time from the start of the output of the test pattern to the detection of the first output pattern sequence identical with the header pattern sequence; a parameter modifying step of modifying at least one parameter of the strobe timing and the threshold value voltage when the delay time is acquired; a test controlling step of causing the test pattern outputting step to output the test pattern sequence once more in a state where the parameter has been modified in the parameter modifying step; and an expectation comparing step of outputting a comparison result between a second output pattern sequence acquired in the signal comparing step after the output of the test pattern sequence is started once more and then a predetermined offset time elapses from the elapsed point of the delay time and an expectation pattern sequence of the second output pattern sequence.

According to the fifth aspect of the present invention, there is provided a testing device that decides the good or bad of a device under test based on a comparison result between an output pattern sequence sequentially output from a terminal of the device under test and an expectation pattern sequence to be compared with the output pattern sequence. The testing device includes: a sequence controlling unit operable to sequentially execute a plurality of commands included in a test program of the device under test and read an expectation pattern corresponding to each of the executed commands from a memory; a header pattern detecting unit operable to detect whether an output pattern sequence identical with a predetermined header pattern sequence is output from the device under test when a detection starting command to indicate a detection start of the output pattern sequence identical with the header pattern sequence has been executed; an expectation comparing unit operable to compare the output pattern sequence and the expectation pattern sequence; and a timing adjusting unit operable to respectively synchronize and input expectation patterns and output patterns to be compared with the expectation patterns into the expectation comparing unit in the same cycle when an output pattern sequence identical with the header pattern sequence has been detected.

The sequence controlling unit may respectively execute the commands by means of an instruction execution pipeline consisting of a plurality of stages having a comparing stage of comparing the output pattern with the expectation pattern, and the timing adjusting unit may perform an adjustment to input an output pattern to be compared with the expectation pattern into the comparing stage in the timing in which the expectation pattern is input into the comparing stage.

The timing adjusting unit may input an expectation pattern corresponding to one command and an output pattern acquired during executing the one command into the expectation comparing unit in the same cycle when a detection terminating command to indicate a detection termination of the header pattern sequence has been executed by the sequence controlling unit.

The testing device may further include a header pattern storing unit operable to store the plurality of header pattern sequences, the sequence controlling unit may execute a command including an instruction selecting a header pattern sequence of a detection object from the header pattern storing unit as the detection starting command, and the header pattern detecting unit may detect whether an output pattern sequence identical with a header pattern sequence selected based on the detection starting command is output from the device under test.

The testing device may further include an error informing unit operable to inform of the failure of detection of the header pattern sequence when an output pattern sequence identical with the header pattern sequence has not been detected within a predetermined period after starting the detection of the header pattern sequence.

According to the sixth aspect of the present invention, there is provided a testing method deciding the good or bad of a device under test based on a comparison result between an output pattern sequence sequentially output from a terminal of the device under test and an expectation pattern sequence to be compared with the output pattern sequence. The testing method includes: a sequence controlling step of sequentially executing a plurality of commands included in a test program of the device under test and reading an expectation pattern corresponding to each of the executed commands from a memory; a header pattern detecting step of detecting whether an output pattern sequence identical with a predetermined header pattern sequence is output from the device under test when a detection starting command to indicate a detection start of the output pattern sequence identical with the header pattern sequence has been executed; an expectation comparing step of comparing the output pattern sequence and the expectation pattern sequence; and a timing adjusting step of respectively synchronizing and comparing expectation patterns and output patterns to be compared with the expectation patterns in the same cycle in the expectation comparing step when an output pattern sequence identical with the header pattern sequence has been detected.

According to the seventh aspect of the present invention, there is provided a testing device that decides the good or bad of a device under test based on a comparison result between an output pattern sequence sequentially output from a terminal of the device under test and an expectation pattern sequence to be compared with the output pattern sequence. The testing device includes: a header pattern detecting unit operable to detect whether an output pattern sequence identical with a predetermined header pattern sequence is output from the device under test; an expectation comparing unit operable to compare an output pattern sequence output from the device under test following the output pattern sequence identical with the header pattern sequence with the expectation pattern sequence when the output pattern sequence identical with the header pattern sequence has been detected; and a selection writing unit operable to store the comparison result by the expectation comparing unit on a fail memory when an output pattern sequence identical with the header pattern sequence has been detected and store an output pattern sequence of the device under test on the fail memory when an output pattern sequence identical with the header pattern sequence has not been detected.

Moreover, the testing device may further include a command executing unit operable to sequentially execute a plurality of commands including a detection starting command to indicate a detection start of the header pattern sequence every instruction cycle, and the selection writing unit may start an output pattern writing process sequentially writing an output pattern output from the device under test on the fail memory when the detection starting command has been executed and start a process stopping the output pattern writing process and sequentially storing the comparison result by the expectation comparing unit on the fail memory when an output pattern sequence identical with the header pattern sequence has been detected.

Moreover, the selection writing unit may store the output pattern sequence output from the device under test, from the execution of the detection starting command to the elapse of a predetermined command cycles, on the fail memory and may not store the output pattern sequence output after the predetermined command cycles has elapsed on the fail memory, when the output pattern sequence identical with the header pattern sequence is not detected.

According to the eighth aspect of the present invention, there is provided a testing method deciding the good or bad of a device under test based on a comparison result between an output pattern sequence sequentially output from a terminal of the device under test and an expectation pattern sequence to be compared with the output pattern sequence. The testing method includes: a header pattern detecting step of detecting whether an output pattern sequence identical with a predetermined header pattern sequence is output from the device under test; an expectation comparing step of comparing an output pattern sequence output from the device under test following the output pattern sequence identical with the header pattern sequence with the expectation pattern sequence when the output pattern sequence identical with the header pattern sequence has been detected; and a selection writing step of storing the comparison result in the expectation comparing step on a fail memory when an output pattern sequence identical with the header pattern sequence has been detected and storing an output pattern sequence of the device under test on the fail memory when an output pattern sequence identical with the header pattern sequence has not been detected.

According to the ninth aspect of the present invention, there is provided a testing device that decides the good or bad of a device under test based on a comparison result between an output pattern sequence sequentially output from a terminal of the device under test and an expectation pattern sequence to be compared with the output pattern sequence. The testing device includes: a sequence controlling unit operable to sequentially execute a plurality of commands included in a test program of the device under test and read an expectation pattern corresponding to each of the executed commands from a memory; a header pattern detecting unit operable to detect whether an output pattern sequence identical with a predetermined header pattern sequence is output from the device under test when a detection starting command to indicate a detection start of the output pattern sequence identical with the header pattern sequence has been executed; an expectation comparing unit operable to compare an output pattern sequence output from the device under test following the output pattern sequence identical with the header pattern sequence with the expectation pattern sequence when the output pattern sequence identical with the header pattern sequence has been detected; a header detecting range setting unit operable to set an effective range of the commands validating the detection of output pattern sequence identical with the header pattern sequence, among the plurality of commands; and an error decision informing unit operable to inform of an error to indicate the failure of detection of the header pattern sequence on condition that the commands between the detection starting command and the detection terminating command are within the effective range when an output pattern sequence identical with the header pattern sequence has not been detected between the execution of the detection starting command and the execution of the detection terminating command terminating the detection of the header pattern sequence.

Moreover, the testing device may further include a header detecting range setting register operable to store a start address that is an address of the command of a start position of the effective range and a termination address that is an address of the command of a termination position of the effective range, the header detecting range setting unit may set the effective range by storing a value on the header detecting range setting register, and the error decision informing unit may inform of an error to indicate the failure of detection of the header pattern sequence on condition that the detection starting command and the detection terminating command are executed, between the start address stored on the header detecting range setting register and the termination address stored on the header detecting range setting register.

Moreover, the testing device may further include an effective comparison range setting unit operable to set a comparison window showing validity of the comparison between an expectation pattern and an output pattern corresponding to the one command in association with at least one command, and the header detecting range setting unit may validate the detection of header pattern sequence between the detection starting command and the detection terminating command when the comparison window is set corresponding to at least one command between the detection starting command and the detection terminating command.

According to the tenth aspect of the present invention, there is provided a testing method deciding the good or bad of a device under test based on a comparison result between an output pattern sequence sequentially output from a terminal of the device under test and an expectation pattern sequence to be compared with the output pattern sequence. The testing method includes: a sequence controlling step of sequentially executing a plurality of commands included in a test program of the device under test and reading an expectation pattern corresponding to each of the executed commands from a memory; a header pattern detecting step of detecting whether an output pattern sequence identical with a predetermined header pattern sequence is output from the device under test when a detection starting command to indicate a detection start of the output pattern sequence identical with the header pattern sequence has been executed; an expectation comparing step of comparing an output pattern sequence output from the device under test following the output pattern sequence identical with the header pattern sequence with the expectation pattern sequence when the output pattern sequence identical with the header pattern sequence has been detected; a header detecting range setting step of setting an effective range of the commands validating the detection of output pattern sequence identical with the header pattern sequence, among the plurality of commands; and an error decision informing step of informing of an error to indicate the failure of detection of the header pattern sequence on condition that the commands between the detection starting command and the detection terminating command are within the effective range when an output pattern sequence identical with the header pattern sequence has not been detected between the execution of the detection starting command and the execution of the detection terminating command terminating the detection of the header pattern sequence.

The summary of the invention does not necessarily describe all necessary features of the present invention. The present invention may also be a sub-combination of the features described above.

According to the present invention, it is possible to adequately test a margin of an output signal output from a device under test. Moreover, although the output timing of the output pattern sequence is not defined, it is possible to synchronize and compare the output pattern sequence with reading the expectation pattern sequence. Furthermore, it is possible to easily pursue a cause thereof when a header pattern showing the start of the test has not been detected. Moreover, it is possible to adequately set a range validating the detection of header pattern sequence.

BRIEF DESCRIPTION OF THE DRAWINGS

FIG. 16 is a view exemplary showing a hunting window according to Example 4.

FIG. 17 is a view exemplary showing a comparison window according to Example 4.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

EXAMPLE 1

Figure 1:
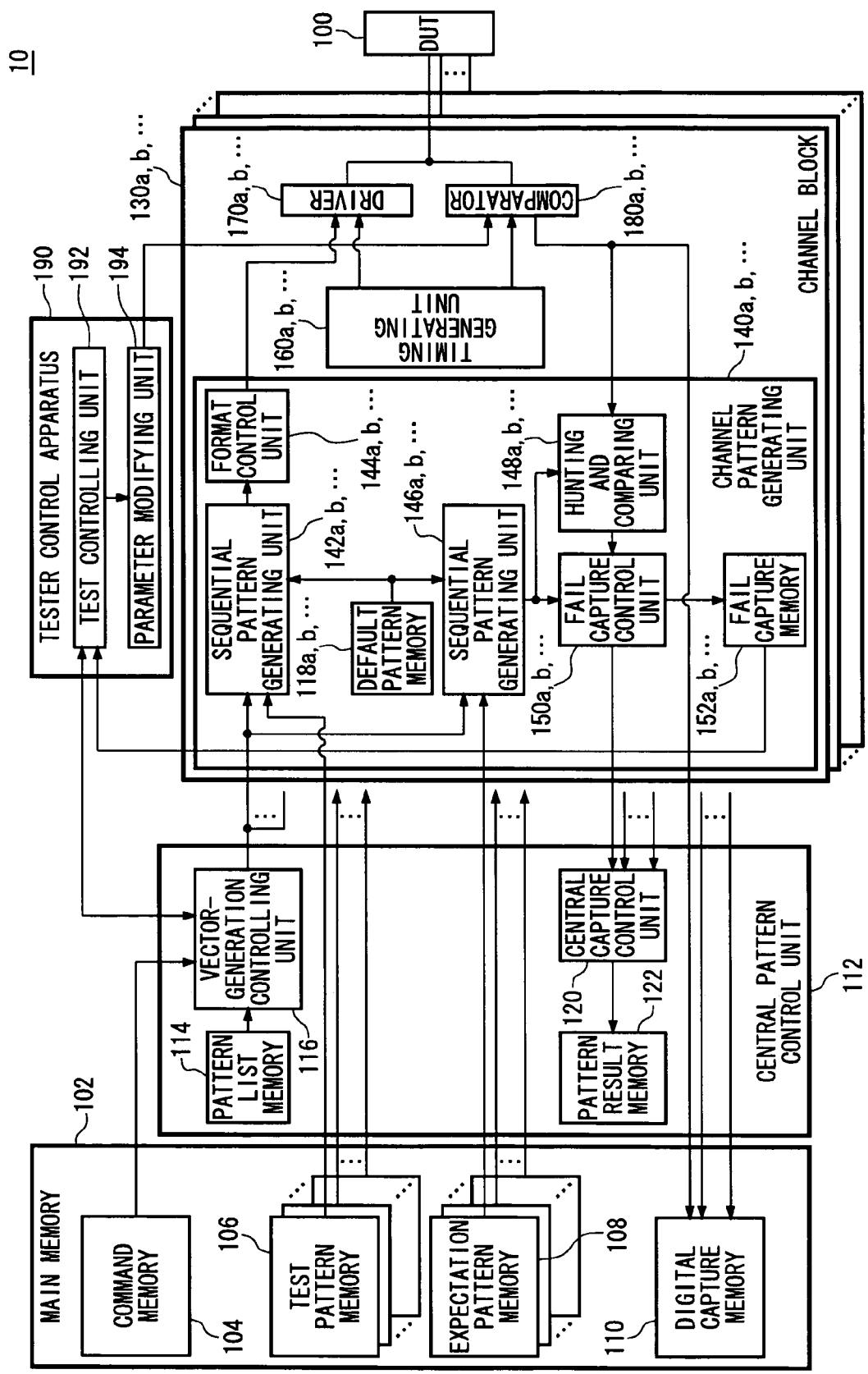
FIG. 1 shows a configuration of a testing device according to Example 1.

FIG. 1 shows a configuration of a testing device 10 according to Example 1. The testing device 10 is a testing device that tests a device under test (DUT) 100 including one terminal or a plurality of terminals, and has a margin testing function to test a margin of an output signal output from the output terminal of the device under test. The testing device 10 includes a main memory 102, a central pattern control unit 112, a plurality of channel blocks 130, and a tester control device 190.

The main memory 102 stores a test program for the DUT 100, and records an output pattern output from the DUT 100 by executing the test program. The main memory 102 has a command memory 104, a plurality of test pattern memories 106, a plurality of expectation pattern memories 108, and a digital capture memory 110.

The command memory 104 stores each command included in the test program. Each of the plurality of test pattern memories 106 is provided corresponding to each terminal of the DUT 100, and stores a test pattern sequence being used during a command cycle period carrying out that command for each terminal in association with each command. Here, the test pattern sequence includes a plurality of test patterns to be sequentially output to the terminals of the DUT 100 during a command cycle period. For example, when the testing device 10 generates a 32-bit signal per one command cycle and outputs the signal to the DUT 100, the test pattern memory 106 stores the test pattern sequence made up of 32 test patterns corresponding to the 32-bit signal output during one command cycle period in association with each command.

Each of the plurality of expectation pattern memories 108 is provided corresponding to each terminal of the DUT 100, and stores an expectation pattern sequence being used during a command cycle period carrying out that command for each terminal in association with each command. Here, the expectation pattern sequence includes a plurality of expectation patterns to be sequentially compared with a plurality of output patterns sequentially output from the terminals of the DUT 100 during a command cycle period. The digital capture memory 110 records the output patterns output from the DUT 100 by executing the program.

As described above, the command memory 104, the plurality of test pattern memories 106, the plurality of expectation pattern memories 108, and the digital capture memory 110 may respectively be divided and provided in separate memory modules composing the main memory 102, or may respectively be provided in different memory areas in the same memory module.

The central pattern control unit 112 is connected to the main memory 102 and the plurality of channel blocks 130, and performs a process common to each terminal of the DUT 100. The central pattern control unit 112 has a pattern list memory 114, a vector-generation controlling unit 116, a central capture control unit 120, and a pattern result memory 122.

The pattern list memory 114 stores start/termination addresses of the routine in the command memory 104, a start address of the test pattern in the test pattern memory 106, a start address of the expectation pattern in the expectation pattern memory 108, or the like in regard to each of a main routine and each subroutine of the test program. The vector-generation controlling unit 116 functions as a sequential control unit according to the present invention along with a sequential pattern generating unit 146 and also functions as a command executing unit according to the present invention. Then, the vector-generation controlling unit 116 sequentially executes the commands included in the test program of the DUT 100 every command cycle. More specifically, the vector-generation controlling unit 116 sequentially reads the commands from the start address to the termination address from the pattern list memory 114 for each routine in order to sequentially execute them.

The central capture control unit 120 receives a decision result for each terminal of the DUT 100 from each of the channel block 130, and totals the decision results of the DUT 100 for each routine. The pattern result memory 122 stores the decision results of the DUT 100 for each routine.

Each of the plurality of channel blocks 130 is provided corresponding to each of the terminals of the DUT 100. For example, the channel block 130a is provided corresponding to one terminal of the DUT 100 and the channel block 130b is provided corresponding to another terminal of the DUT 100. Since each of the channel blocks 130a, 130b, and ... has the generally same configuration as each other, the channel blocks 130a and 130b are referred to as "a channel block 130" except for the following difference. Each channel block 130 has a channel pattern generating unit 140, a timing generating unit 160, a driver 170, and a comparator 180. For example, the channel block 130a has a channel pattern generating unit 140a, a timing generating unit 160a, a driver 170a, and a comparator 180a.

The channel pattern generating unit 140 generates a test pattern sequence or an expectation pattern sequence to be used for testing the terminal, and compares the output pattern sequence of the DUT 100 and the expectation pattern sequence. The channel pattern generating unit 140 includes a default pattern memory 118, a sequential pattern generating unit 142, a format control unit 144, a sequential pattern generating unit 146, a hunting and comparing unit 148, a fail capture control unit 150, and a fail capture memory 152. For example, the channel pattern generating unit 140a includes a default pattern memory 118a, a sequential pattern generating unit 142a, a format control unit 144a, a sequential pattern generating unit 146a, a hunting and comparing unit 148a, a fail capture control unit 150a, and a fail capture memory 152a.

The default pattern memory 118 stores a preset default pattern sequence in association with default pattern identifying information to identify the default pattern sequence among the test pattern sequence and/or the expectation pattern sequence (hereinafter, referred to as a pattern sequence). Here, the test pattern memory 106 and/or the expectation pattern memory 108 store the default pattern identifying information of that default pattern sequence in place of the pattern sequence in itself in case of the same pattern sequence as the default pattern sequence.

The sequential pattern generating unit 142 receives a start address of the test pattern sequence to be output corresponding to an execution routine from the vector-generation controlling unit 116. Then, the sequential pattern generating unit 142 sequentially reads the test pattern sequence from the start address from the test pattern memory 106 corresponding to each command cycle sequentially in order to sequentially output them to the format control unit 144. The format control unit 144 functions as a test pattern outputting unit according to the present invention along with the driver 170, and converts the test pattern sequence into a format to control the driver 170.

The sequential pattern generating unit 146 functions as a sequence controlling unit according to the present invention along with the vector-generation controlling unit 116. Then, the sequential pattern generating unit 146 receives the start address of the expectation pattern sequence from the vector-generation controlling unit 116 corresponding to the execution routine. Then, the sequential pattern generating unit 146 sequentially reads the expectation patterns from the start address from the expectation pattern memory 108 corresponding to each command cycle, to sequentially output them to the hunting and comparing unit 148 and the fail capture control unit 150.

The hunting and comparing unit 148 receives the output pattern sequence output from the DUT 100 via the comparator 180, and compares it with the expectation pattern sequence. Here, the hunting and comparing unit 148 may have a hunting function in which the output pattern sequence having the indefinite timing output from the DUT 100 is compared with the expectation pattern sequence on condition that the specific header pattern sequence is output from the DUT 100. In this case, the hunting and comparing unit 148 may start the detection of the header pattern sequence on condition that a detection starting command starting the detection of the output pattern sequence identical with the header pattern sequence has been executed. The hunting and comparing unit 148 adjusts the timing in which the output pattern sequence is compared with the expectation pattern sequence by means of the hunting function, e.g., based on the time from starting the detection of the header pattern sequence to completing the detection of the header pattern sequence.

The fail capture control unit 150 receives match/mismatch information of the output pattern sequence from the DUT 100 and the expectation pattern sequence from the hunting and comparing unit 148, to generate the decision result of the good or bad for that terminal of the DUT 100. The fail capture memory 152 is an example of a comparison result storing unit according to the present invention, and stores fail information including the result of a hunting process by the hunting and comparing unit 148, the output pattern value that is not identical with the expected value, and so on.

The timing generating unit 160 generates the timing in which the driver 170 outputs each test pattern included in the test pattern sequence and the timing in which the comparator 180 acquires the output patterns from the DUT 100. The driver 170 functions as a test pattern outputting unit according to the present invention along with the format control unit 144, and outputs each test pattern output from the format control unit 144 in the channel pattern generating unit 140 to the DUT 100 in the timing designated by the timing generating unit 160. The comparator 180 acquires the output pattern output from the terminal of the DUT 100 and supplies it to the hunting and comparing unit 148 in the channel block 130 and the digital capture memory 110, in the timing designated by the timing generating unit 160.

In addition, the channel pattern generating unit 140 may have a configuration including a common sequential pattern generating unit having the functions of the sequential pattern generating unit 142 and the sequential pattern generating unit 146, in place of a configuration separately having the sequential pattern generating unit 142 and the sequential pattern generating unit 146 described above.

The tester control apparatus 190 has a test controlling unit 192 and a parameter modifying unit 194, and controls the testing device 10. In case of a margin test, the test controlling unit 192 controls the vector-generation controlling unit 116 so that the test causing the DUT 100 to output the header pattern and the output pattern of a comparison object is carried out more than once. Then, the test controlling unit 192 acquires a plurality of test results from the fail capture memory 152, and outputs them to a user of the testing device 10 as a margin measurement result of the output signal from the DUT 100. The parameter modifying unit 194 modifies a parameter such as the acquisition timing or a threshold value voltage of the output signal related to the test, with respect to each test carried out by the test controlling unit 192.

Figure 2:
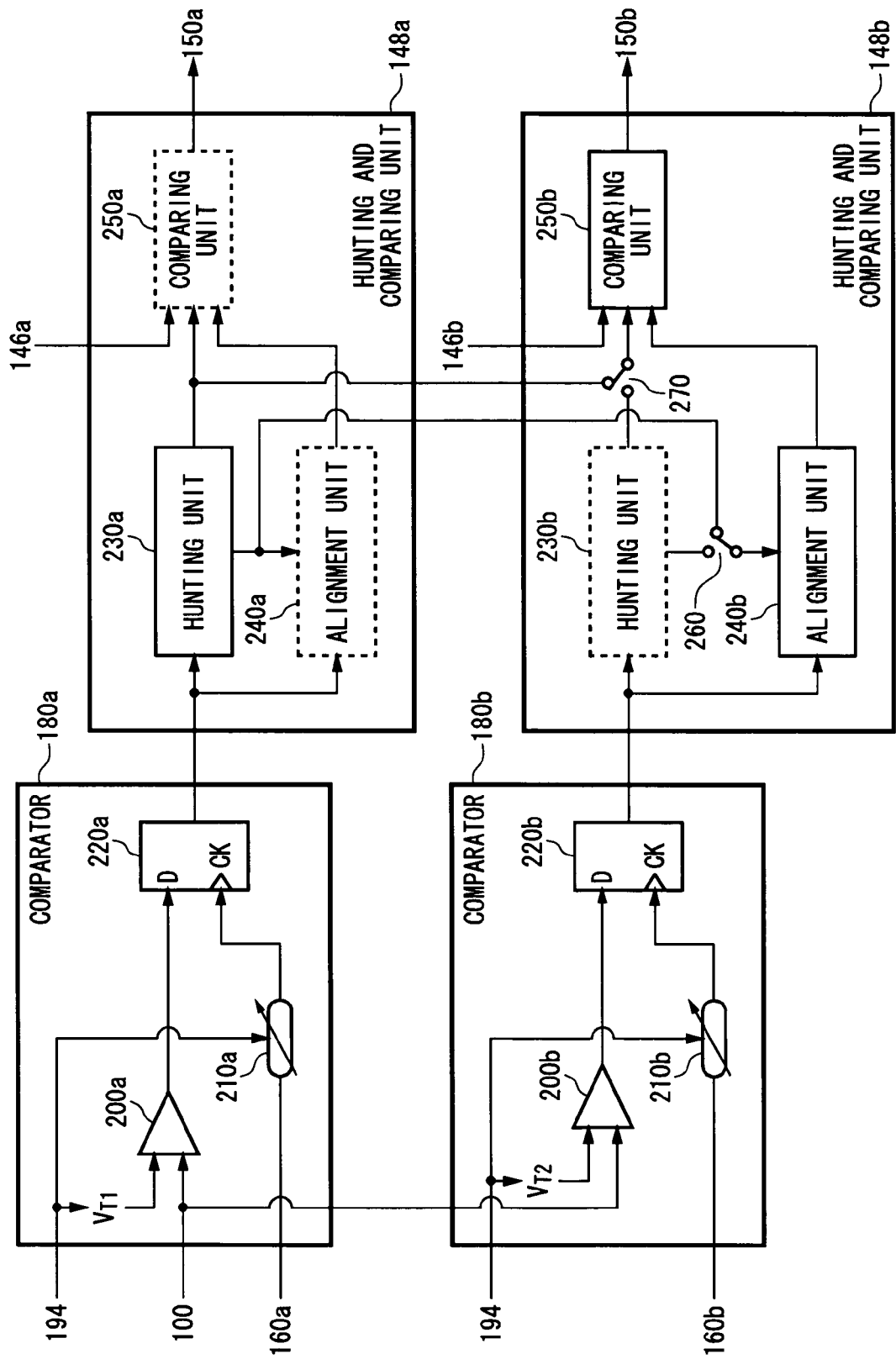
FIG. 2 shows a configuration of a comparator and a hunting and comparing unit according to Example 1.

FIG. 2 shows a configuration of the comparator 180 and the hunting and comparing unit 148 according to Example 1. According to the present embodiment, in order to perform a margin test of the output signal corresponding to one output terminal of the DUT 100, the first channel block 130a having the comparator 180a and the hunting and comparing unit 148a is used for detecting the header pattern and the second channel block 130b having the comparator 180b and the hunting and comparing unit 148b is used for detecting the correspondence between the output pattern and the expectation pattern.

The comparator 180a includes a voltage comparator 200a, a delay element 210a, and an FF (flip-flop) 220a. The voltage comparator 200a compares an output signal voltage of each of the output patterns included in the output pattern sequence output from the output terminal of the DUT 100 with a first predetermined threshold value voltage VT1. More specifically, the voltage comparator 200a outputs a logical value "1" when the output signal voltage exceeds the VT1 and a logical value "0" when the output signal voltage does not exceed the VT1, as the value of the output pattern. The delay element 210a delays the timing designated by the timing generating unit 160 in the first channel block 130 by a delay amount designated by the parameter modifying unit 194, in order to generate a strobe signal of a first predetermined strobe timing during a cycle period of the output signal. The FF 220a acquires an output signal from the voltage comparator 200a in the first strobe timing. In this way, the FF 220a acquires a value of each of the output patterns included in the output pattern sequence based on the comparison result between a voltage of the output signal and the first threshold value voltage in the first strobe timing. By the above-mentioned configuration, the comparator 180a acquires a first output pattern sequence output from the output terminal.

The comparator 180b includes a voltage comparator 200b, a delay element 210b, and an FF 220b. The voltage comparator 200b has the substantially same function and configuration as those of the voltage comparator 200a. The voltage comparator 200b is connected to the same output terminal as the output terminal of the DUT 100 connected to the voltage comparator 200a, and compares a voltage of the output signal and a second predetermined threshold value voltage VT2 with respect to each of the output patterns included in the output pattern sequence output from the output terminal. The delay element 210b has the generally same function and configuration as those of the delay element 210a, and generates a strobe signal of a second predetermined strobe timing during a cycle period of the output signal. The FF 220b has the generally same function and configuration as those of the FF 220a, and acquires the output signal from the voltage comparator 200b in the second strobe timing. In this way, the FF 220b acquires a value of each of the output patterns included in the output pattern sequence based on the comparison result between a voltage of the output signal and the second threshold value voltage in the second strobe timing. By the above-mentioned configuration, the comparator 180b acquires a second output pattern sequence output from the output terminal.

The hunting and comparing unit 148a includes a hunting unit 230a, an alignment unit 240a, and a comparing unit 250a. The hunting unit 230a detects that the first output pattern sequence acquired by the comparator 180a is identical with a header pattern sequence that is a predetermined pattern sequence. Here, the hunting unit 230a may use a pattern sequence consisting of one or a plurality of header patterns as a header pattern sequence, to compare the pattern sequence with the first output pattern sequence consisting of one or a plurality of output patterns. The alignment unit 240a and the comparing unit 250a have the same function and a configuration as those of the alignment unit 240b and the comparing unit 250b. However, the alignment unit 240a and the comparing unit 250a are not used for a margin test.

The hunting and comparing unit 148b includes a hunting unit 230b, an alignment unit 240b, a comparing unit 250b, a switch 260, and a switch 270. The hunting unit 230b has the same function and a configuration as those of the hunting unit 230a. However, the hunting unit 230b is not used for a margin test. The alignment unit 240b synchronizes the second output pattern sequence output from the FF 220b with the expectation pattern sequence supplied from the sequential pattern generating unit 146b in the second channel block 130 to the comparing unit 250b. More specifically, the alignment unit 240b delays the second output pattern sequence by the number of cycles designated by the hunting unit 230 connected to the alignment unit 240, in order to synchronize the second output pattern sequence with the expectation pattern sequence. When the correspondence between the first output pattern sequence and the header pattern sequence has been detected, the comparing unit 250b compares the second output pattern sequence acquired by the comparator 180b and the expectation pattern sequence of the second output pattern sequence supplied from the sequential pattern generating unit 146, and outputs its comparison result.

The switch 260 connects one of the hunting unit 230a and the hunting unit 230b to the alignment unit 240b. The switch 270 connects one of the hunting unit 230a and the hunting unit 230b to the comparing unit 250b. Here, when the second channel block 130 having the hunting and comparing unit 148b is used independently, the switch 260 and the switch 270 respectively connect the hunting unit 230b to the alignment unit 240b and the comparing unit 250b. On the other hand, when a margin test is performed using the first channel block 130 and the second channel block 130 as a set, the switch 260 respectively connects the hunting unit 230a to the alignment unit 240b and the comparing unit 250b.

Figure 3:
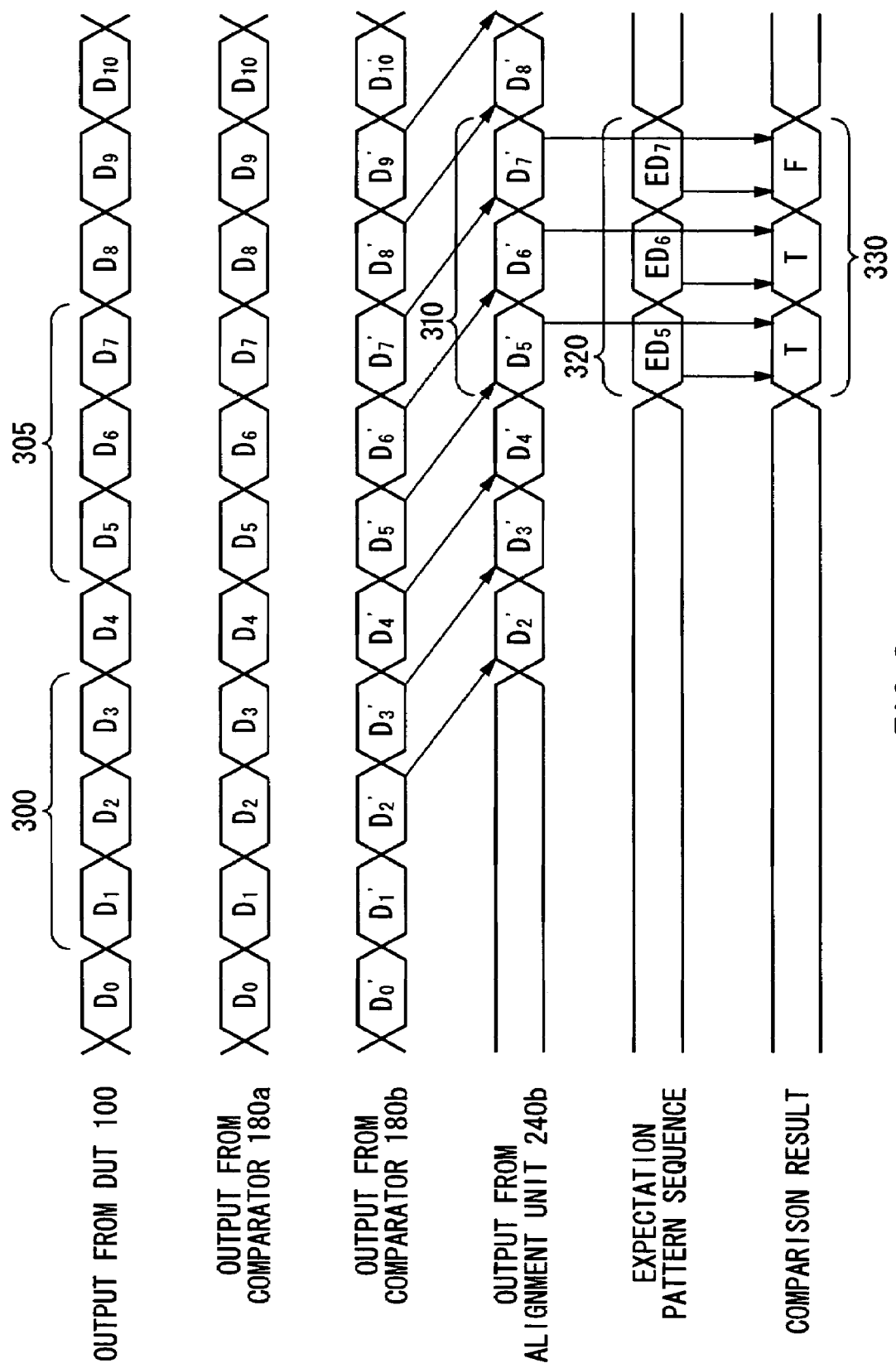
FIG. 3 shows a test operation by the testing device according to Example 1.

FIG. 3 shows a test operation by the testing device 10 according to Example 1. In a margin test to get Shmoo plotting, the test controlling unit 192 carries out a test causing the DUT 100 to output the same output pattern sequence as the header pattern sequence and the same output pattern sequence as the expectation pattern sequence, more than once. More specifically, the test controlling unit 192 repeatedly executes the test program for the test by means of the vector-generation controlling unit 116.

The parameter modifying unit 194 sequentially modifies the second strobe timing and the second threshold value voltage to be set for the comparator 180b with respect to each of the tests to be executed more than once. In other words, when the second test is executed after executing the first test, in the second test the parameter modifying unit 194 modifies at least one parameter of the second strobe timing and the second threshold value voltage into a value different from that in the first test. On the other hand, in each test the parameter modifying unit 194 holds the first strobe timing and the first threshold value voltage to be set for the comparator 180a with a value by which the output signal from the DUT 100 can precisely be acquired. In other words, the parameter modifying unit 194 sets the first strobe timing and the first threshold value voltage to an ideal value determined by a specification of the DUT 100.

In each test, the vector-generation controlling unit 116, the sequential pattern generating unit 142, the format control unit 144, and the driver 170 output a test pattern sequence, by which the same output pattern sequence as the header pattern sequence and the same output pattern sequence as the expectation pattern sequence are output, to the DUT 100. The DUT 100 receives the sequence, and outputs a comparison object pattern sequence 305 to be compared with the header pattern sequence 300 and the expectation pattern sequence.

The comparator 180a sequentially acquires the output patterns D0, D1, . . . , D10 output from the DUT 100 and outputs them as a series of the first output pattern, using the first strobe timing and the first threshold value voltage set to the ideal value. Moreover, the comparator 180b sequentially acquires the output patterns D0, D1, . . . , D10 output from the DUT 100 and outputs them as a series of the second output pattern, using the second strobe timing and the second threshold value voltage. Here, at least one side of the first and second strobe timings and the first and second threshold value voltages are set to the values different form each other for the measurement of the margin. For this purpose, depending on the setting of the second strobe timing and the second threshold value voltage, the comparator 180*b* may acquire the wrong output pattern output from the DUT 100. Thus, in order to show a possibility of an error, the output patterns acquired by the comparator 180*b* is shown with D0', D1', ..., D10'.

In this example, the header pattern sequence D1, D2, D3 is set for the hunting unit 230*a*.

For this reason, when the comparator 180*a* outputs the first output pattern sequence D1, D2, D3, the hunting unit 230*a* detects that the first output pattern sequence is identical with the header pattern sequence. Then, the alignment unit 240*b* synchronizes a series of the second output patterns output from the comparator 180*b* with the expectation pattern sequence 320 supplied by the sequential pattern generating unit 146.

Next, the comparing unit 250*b* compares the second output data sequence D5, D6, D7 acquired by the comparator 180*b* corresponding to the comparison object pattern sequence 305 and ED5, ED6, ED7 that are the expectation pattern sequence 320 of the second output data sequence, and outputs the comparison result 330 including a match (T: True) or a mismatch (F: False) for each pattern. Here, the offset time from the acquisition of the first output pattern sequence corresponding to the header pattern sequence 300 to the acquisition of the second output pattern sequence corresponding to the comparison object pattern sequence 305 is previously specified by the test program. Then, when the first output pattern sequence is identical with the header pattern sequence 300, the comparing unit 250*b* outputs the comparison result between the comparison object pattern sequence 310 that is the second output pattern sequence acquired after a predetermined offset time from the acquisition of the first output pattern sequence and the expectation pattern sequence 320.

The comparison result by the comparing unit 250*b* is supplied to the fail capture memory 152 in the second channel block 130 via the fail capture control unit 150*b* in the second channel block 130. Then, the fail capture memory 152 stores the comparison result between the second output pattern sequence and the expectation pattern sequence in association with the second strobe timing and the second threshold value voltage.

After carrying out the above test more than once while changing the second strobe timing and/or the second threshold value voltage, the comparison results corresponding to each set value of the second strobe timing and the second threshold value voltage are accumulated in the fail capture memory 152*b*. The test controlling unit 192 acquires the comparison result output from the comparing unit 250*b* from the fail capture memory 152*b* for each of the plurality of tests, and outputs a range of the second strobe timing and the second threshold value voltage, in which the second output pattern sequence is identical with the expectation pattern sequence, to a user of the testing device 10 based on these comparison results. In this case, the test controlling unit 192 may display the Shmoo plotting of the pass/fail for each of the second strobe timing and the second threshold value voltage for the user.

According to the testing device 10 described above, while detecting the header patterns using an appropriate strobe timing and threshold value voltage and changing the strobe timing and the threshold value voltage, it is possible to test whether the output signal can precisely be acquired.

In addition, in this case, the header pattern sequence 300, the comparison object pattern sequence 305, the comparison object pattern sequence 310, and the expectation pattern sequence 320 may include a plurality of patterns, or may include only single pattern.

Moreover, the first output pattern sequence to be identical with the header pattern sequence 300 and the comparison object pattern sequence 305 that is the second output pattern sequence to be compared with the comparison result 330 may be the same pattern sequence output from the output terminal of the DUT 100 in the same timing. In this case, the detection of the header pattern sequence by the hunting unit 230*a* is performed in parallel with the comparison with the expectation pattern sequence by the comparing unit 250*b*. Then, the comparing unit 250*b* stores the comparison result at the time when the header pattern sequence was detected on the fail capture memory 152*b*.

Figure 4:
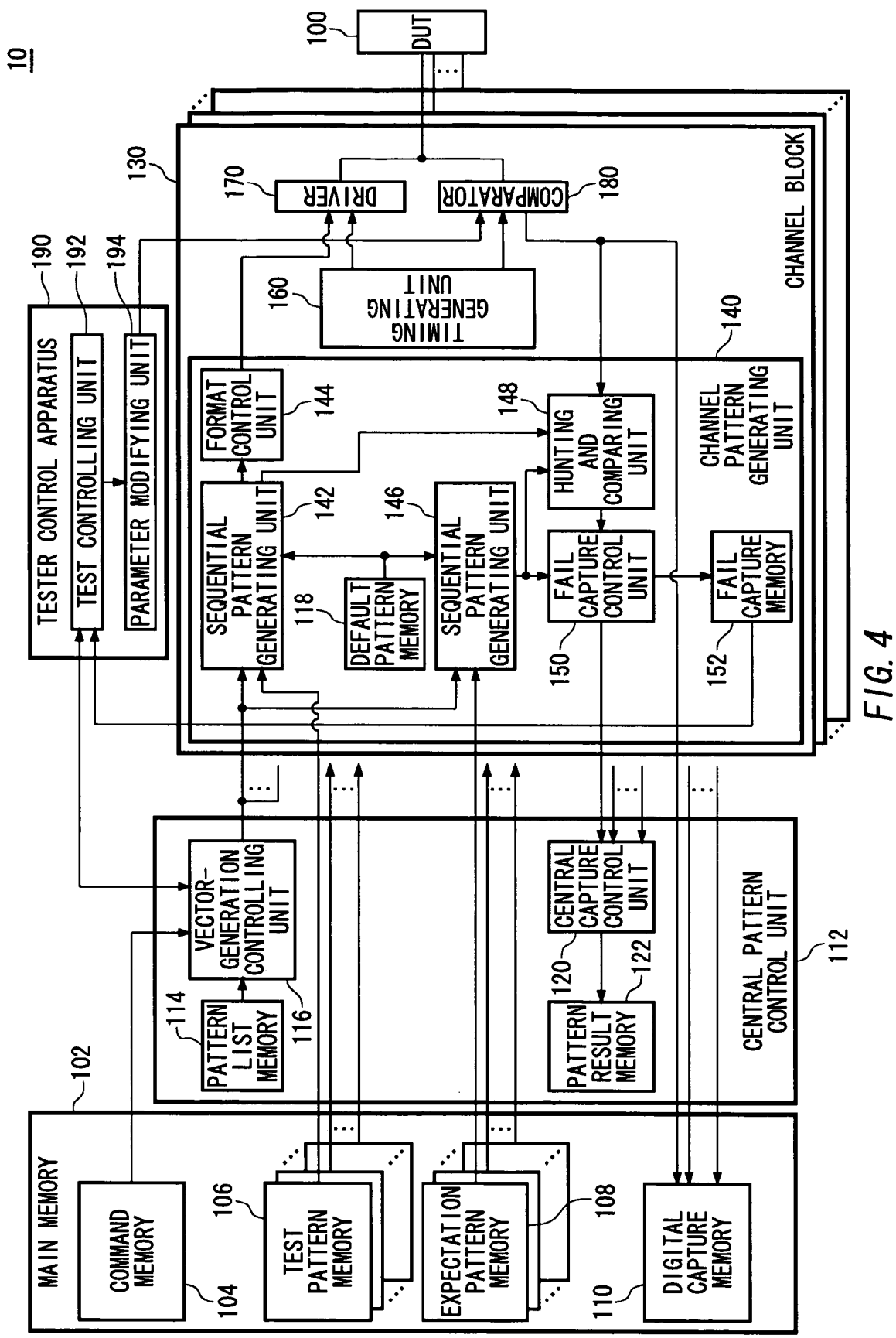
FIG. 4 shows a configuration of the testing device according to an alternative example of Example 1.

FIG. 4 shows a configuration of the testing device 10 according to an alternative example of Example 1. Since the components of FIG. 4 having the same reference numbers as those of FIG. 1 have the generally same functions or configurations as those of FIG. 1, their descriptions will be omitted except for the following difference. Moreover, since the channel blocks 130*a*, 130*b*, ... shown in FIG. 1 have the generally same functions as one another in the present example, these blocks are generally referred to as a channel block 130.

The testing device 10 according to the alternative example uses one channel block 130 in order to perform a margin test of an output signal corresponding to one output terminal of the DUT 100. To realize this, the hunting and comparing unit 148 receives the timing, in which the output of a test pattern based on the test program is started, from the sequential pattern generating unit 142, and previously acquires the delay time from starting the output of the test pattern to acquiring a header pattern sequence. Then, in the margin test the hunting and comparing unit 148 specifies the timing in which a comparison object pattern sequence is output by means of the delay time.

Figure 5:
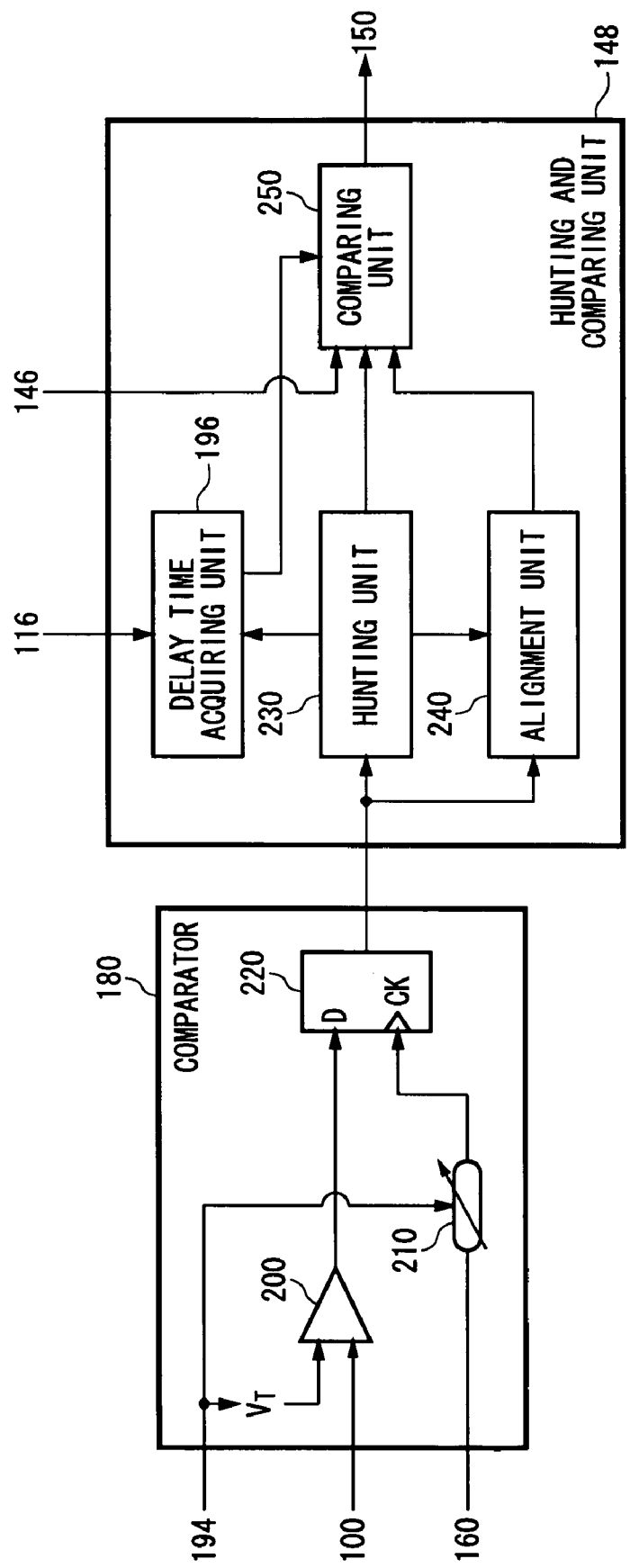
FIG. 5 shows a configuration of the comparator and the hunting and comparing unit according to an alternative example of Example 1.

FIG. 5 shows a configuration of the comparator 180 and the hunting and comparing unit 148 according to an alternative example of Example 1. Since the components of FIG. 5 having the same reference numbers as those of FIG. 2 have the generally same functions or configurations as those of FIG. 2, their descriptions will be omitted except for the following difference.

The comparator 180 has the same function and configuration as those of the comparator 180*a/b* shown in FIG. 2. The hunting and comparing unit 148 includes a hunting unit 230, an alignment unit 240, a comparing unit 250, and a delay time acquiring unit 196. The hunting unit 230, the alignment unit 240, and the comparing unit 250 respectively have the same function and configuration as those of the hunting unit 230*a/b*, the alignment unit 240*a/b*, and the comparing unit 250*a/b* shown in FIG. 2.

When the program is executed to measure the delay time, the delay time acquiring unit 196 receives a test pattern output starting notice showing the start of the output of the test pattern based on the program, from the sequential pattern generating unit 142. Moreover, the delay time acquiring unit 196 receives a header pattern detecting notice showing that the output pattern sequence acquired by the comparator 180 is identical with the header pattern sequence, from the hunting unit 230. Then, the delay time acquiring unit 196 acquires and stores the delay time from the start of the output of the test pattern to the detection of the output pattern sequence identical with the header pattern sequence based on the timing in which the test pattern output starting notice is received and the timing in which the header pattern detecting notice is received.

Moreover, when the output of the test pattern is started for a margin test, the delay time acquiring unit 196 receives the test pattern output starting notice showing that the output of the test pattern is started from the sequential pattern generating unit 142 once more. Then, the delay time acquiring unit 196 specifies the timing in which the comparison object pattern sequence is output based on the timing in which the test pattern output starting notice is received and the delay time, and instructs the comparing unit 250 to compare the comparison object pattern sequence and the expectation pattern sequence.

Figure 6:
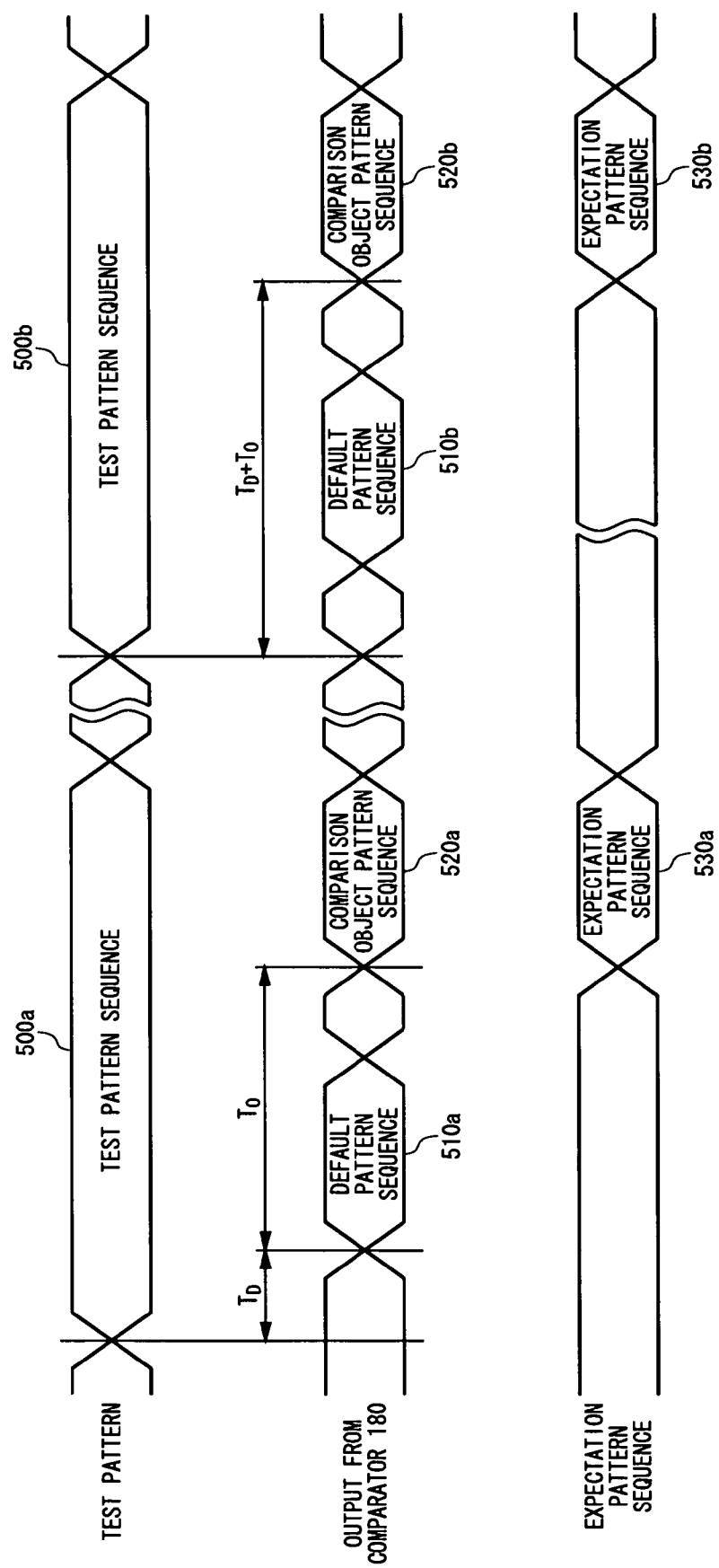
FIG. 6 shows a test operation by the testing device according to an alternative example of Example 1.

FIG. 6 shows a test operation by the testing device 10 according to an alternative example of Example 1. At first, the testing device 10 carries out the test program to be used for a margin test based on an instruction by the test controlling unit 192 in order to compute the delay time. In this case, the parameter modifying unit 194 will set the strobe timing and the threshold value voltage, in which the output signal can adequately be acquired from the DUT 100, in the comparator 180.

When the program is carried out by the vector-generation controlling unit 116 and the sequential pattern generating unit 142, the format control unit 144 and the driver 170 output a test pattern sequence 500a, by which a default pattern sequence 510a is output from the output terminal of the DUT 100, to the DUT 100. The delay time acquiring unit 196 receives the timing, in which the output of the test pattern sequence 500a is started, from the sequential pattern generating unit 142 by the test pattern output starting notice. When detecting the correspondence between the output pattern sequence acquired by the comparator 180 and the default pattern sequence 510a, the hunting unit 230 informs the delay time acquiring unit 196 of the effect by the header pattern detecting notice. The delay time acquiring unit 196 acquires delay time TD from the timing in which the output of the test pattern sequence 500a is started and the default pattern sequence 510a is detected to the detection of the output pattern sequence identical with the default pattern sequence 510a after starting the output of the test pattern sequence 500a.

The parameter modifying unit 194, when the delay time TD is acquired, modifies at least one parameter of the strobe timing and the threshold value voltage. In other words, for example, the parameter modifying unit 194 may modify these parameters after terminating the execution of the test program by which the test pattern sequence 500a is output.

Next, the test controlling unit 192 instructs the vector-generation controlling unit 116 to execute the test program once more in a state where that the parameter has been modified by the parameter modifying unit 194. In this way, the test controlling unit 192 causes the format control unit 144 and the driver 170 to output the test pattern sequence once more. The delay time acquiring unit 196 receives the test pattern output starting notice from the sequential pattern generating unit 142 once more in order to start a time check, and waits for the comparison object pattern sequence 520b to be acquired from the DUT 100. More specifically, the delay time acquiring unit 196 waits the timing after previously designated offset time TO from the time point at which the delay time TD elapses after starting the output of the test pattern sequence 500b once more. The offset time TO is time from the output of the default pattern sequence 510a or 510b to the output of the comparison object pattern sequence 520a or 520b. Then, the delay time acquiring unit 196 instructs the comparison between the comparison object pattern sequence 520b and the expectation pattern sequence 530b after the offset time TO from the time point at which the delay time TD elapses after starting the output of the test pattern sequence 500b once more. In this way, the comparing unit 250 outputs the comparison result between the comparison object pattern sequence 520b acquired by the comparator 180 and the expectation pattern sequence 530b of the comparison object pattern sequence 520b after the offset time TO from the time point at which the delay time TD elapses after starting the output of the test pattern sequence 500b once more.

According to the present embodiment, the testing device 10 measures the delay time TD from the start of the output of the test pattern sequence 500a to the acquisition of the default pattern sequence 510a using the appropriate strobe timing and threshold value voltage. In this way, although the default pattern sequence 510b cannot be detected during the margin test, it is possible to specify the timing in which the comparison object pattern sequence 520b is acquired based on the measured delay time TD and the predetermined offset time TO.

EXAMPLE 2

Figure 7:
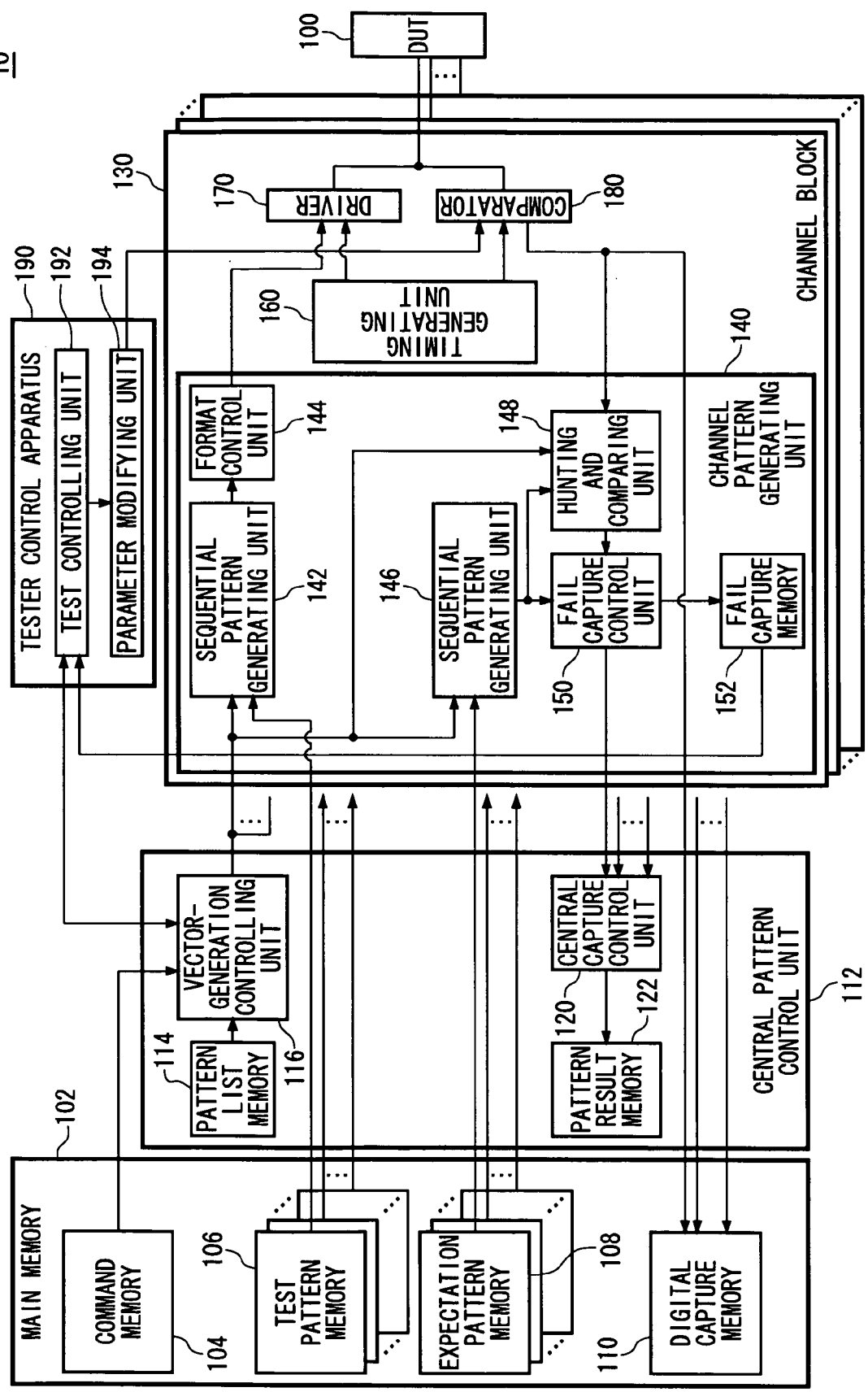
FIG. 7 shows a configuration of the testing device according to Example 2.

FIG. 7 shows a configuration of the testing device 10 according to Example 2. The testing device 10 according to the present example may not include the default pattern memory 118 in the testing device 10 shown in FIG. 1. Since the components of FIG. 7 having the same reference numbers as those of FIG. 1 have the generally same functions or configurations as those of FIG. 1, their descriptions will be omitted except for the following difference. Moreover, since the channel blocks 130a, 130b, . . . shown in FIG. 1 have the generally same functions as one another in the present example, these blocks are generally referred to as a channel block 130.

Figure 8:
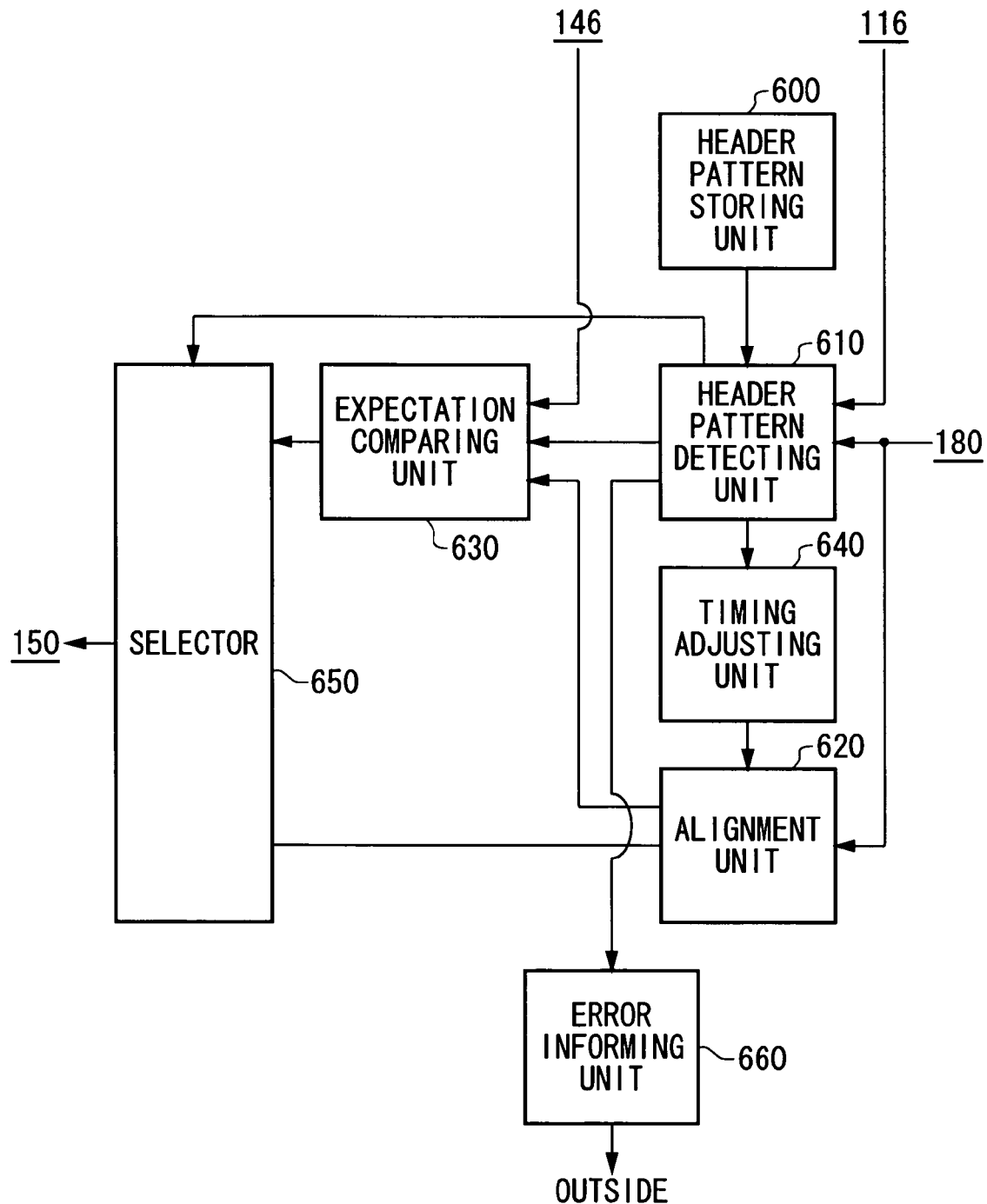
FIG. 8 shows a configuration of the hunting and comparing unit according to Example 2.

FIG. 8 shows a configuration of the hunting and comparing unit 148 according to Example 2. The hunting and comparing unit 148 has a header pattern storing unit 600, a header pattern detecting unit 610, an alignment unit 620, an expectation comparing unit 630, a timing adjusting unit 640, a selector 650, and en error informing unit 660. The header pattern storing unit 600 stores a plurality of header pattern sequences. The header pattern detecting unit 610 decides whether a detection starting command to instruct a detection start of an output pattern sequence identical with the header pattern sequence has been executed, based on a signal received from the vector-generation controlling unit 116. Here, the detection starting command includes an instruction selecting the header pattern sequence for the detection object from the header pattern storing unit 600.

When the detection starting command has been executed, the header pattern detecting unit 610 selects the header pattern sequence for the detection object from the header pattern storing unit 600 based on the detection starting command. Then, the header pattern detecting unit 610 detects whether the output pattern sequence identical with the header pattern sequence is output from the device under test 100, with respect to the header pattern sequences selected by the detection starting command. Specifically, the header pattern detecting unit 610 detects the output pattern sequence identical with the header pattern sequence out of the output signals from the comparator 180.

When the output pattern sequence identical with the header pattern sequence has been detected, the timing adjusting unit 640 sets a parameter to regulate the output timing of the output pattern sequence in the alignment unit 620 based on the elapsed time from the start of the detection of the header pattern sequence to the detection of the header pattern sequence. For example, the timing adjusting unit 640 may set a delay amount delaying the output pattern sequence in the alignment unit 620. It is possible to synchronize the output pattern sequence and the expectation pattern sequence with each other by setting this delay amount adequately.

The alignment unit 620 receives the output pattern sequence output from the device under test 100 from the comparator 180. Then, the alignment unit 620 delays the received output pattern sequence by the delay amount set by the timing adjusting unit 640, to send it to the expectation comparing unit 630 and the selector 650. In addition, when the header pattern sequence is not detected, the alignment unit 620 may output the output pattern sequence without delaying the output pattern sequence.

More specifically, the alignment unit 620 has a plurality of cascaded flip-flops and a selector that selects and outputs the output from either of the plurality of flip-flops. Then, the flip-flop in the first stage sequentially inputs the output pattern sequences. The selector selects and outputs the output from either of the flip-flops based on the delay amount set by the timing adjusting unit 640. In this way, the alignment unit 620 can change the number of flip-flops through which the output patterns pass and can harmonize the timings of the output pattern sequence and the expectation pattern sequence.

The expectation comparing unit 630 compares the output pattern sequence input from the alignment unit 620 and the expectation pattern sequence input from the sequential pattern generating unit 146, and sequentially sends the comparison result to the selector 650, when the header pattern sequence has been detected. The selector 650 receives the comparison result by the expectation comparing unit 630 to send it to the fail capture control unit 150 when the header pattern sequence has been detected. On the other hand, the selector 650 sends the output pattern sequence input from the alignment unit 620 to the fail capture control unit 150 when the header pattern sequence is not detected.

The error informing unit 660 informs a user of the testing device 10 of the effect showing a failure of the detection of the header pattern sequence when the output pattern sequence identical with the header pattern sequence is not detected during a predetermined period after starting the detection of the header pattern sequence. In this way, the user can adequately know occurrence of an error by which the header pattern sequence is not detected, and also can easily investigate a cause of the error by checking the output pattern sequence prior to the error occurrence stored on the fail capture memory 152.

Figure 9:
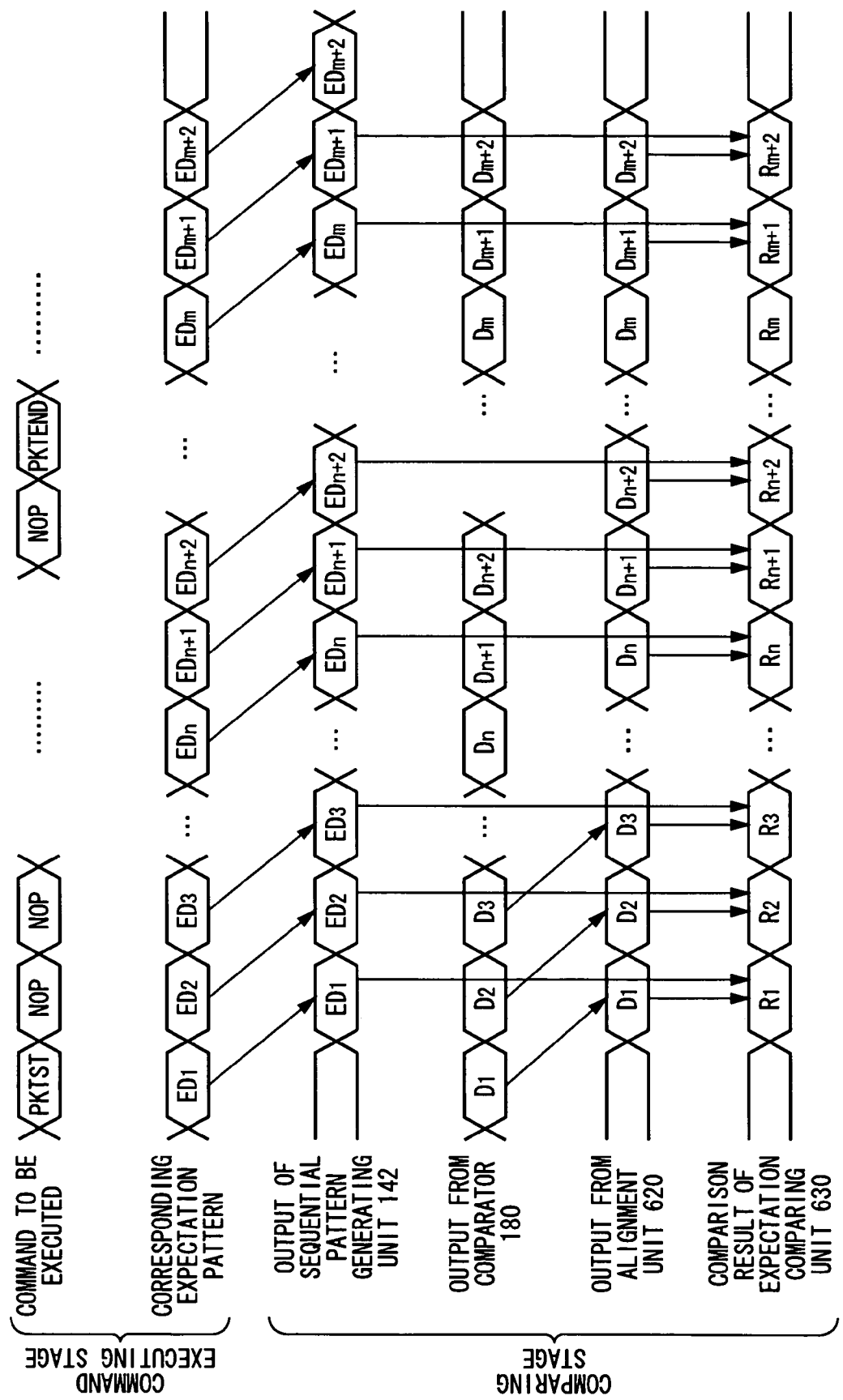
FIG. 9 shows the timing of a process in which a header pattern sequence is detected by the hunting and comparing unit according to Example 2.

FIG. 9 shows the timing of a process in which the expectation pattern sequence and the output pattern sequence are compared according to Example 2. The vector-generation controlling unit 116 executes each command by means of an instruction execution pipeline consisting of a plurality of stages having a command executing stage executing commands and a comparing stage comparing the output patterns with the expectation patterns. More specifically, in the command executing stage, the vector-generation controlling unit 116 sequentially executes every command cycle a plurality of commands including a PKTST command instructing a detection start of the header pattern sequence and a PKTEND command instructing a detection termination of the header pattern sequence. Here, the PKTST command is an example of the detection starting command according to the present invention, and the PKTEND command is an example of the detection terminating command according to the present invention.

The sequential pattern generating unit 146 sequentially reads the expectation patterns corresponding to the plurality of commands from the expectation pattern memory 108. For example, the sequential pattern generating unit 146 reads $ED_1$ that is the expectation pattern corresponding to the PKTST command. Moreover, the sequential pattern generating unit 146 reads $ED_2$ that is the expectation pattern corresponding to a NOP command next to the PKTST command. Here, since the comparing stage is executed after the command executing stage, the timing in which the expectation pattern sequence is input into the comparing stage is later than the timing in which the corresponding command is executed in the command executing stage.

In the comparing stage, the comparator 180 acquires the output pattern output from the terminal of the DUT 100, and supplies it to the hunting and comparing unit 148. For example, the comparator 180 sequentially acquires the output pattern sequences $D_1, D_2, D_3, \ldots, D_n, D_{n+1}$, and $D_{n+2}$ to supply them to the hunting and comparing unit 148. The alignment unit 620 delays the output pattern sequences by the delay amount set by the timing adjusting unit 640 to output them to the expectation comparing unit 630.

More specifically, the timing adjusting unit 640 performs an adjustment, by which the output pattern sequences $D_1$, $D_2$, and $D_3$ to be compared with the expectation pattern sequences $ED_1$, $ED_2$, and $ED_3$ are input into the comparing stage in the timing in which the expectation pattern sequences $ED_1$, $ED_2$, and $ED_3$ are input into the comparing stage, by setting an appropriate delay amount in the alignment unit 620. Similarly, the timing adjusting unit 640 inputs the output pattern sequences $D_n$, $D_{n+1}$, and $D_{n+2}$ to be compared with the expectation pattern sequences $ED_n$, $ED_{n+1}$, and $ED_{n+2}$ into the comparing stage in the timing in which the expectation pattern sequences $ED_n$, $ED_{n+1}$, and $ED_{n+2}$ are input into the comparing stage. In this way, the timing adjusting unit 640 synchronizes each expectation pattern and the output pattern to be compared with the expectation pattern with each other, to input them into the expectation comparing unit 630 in the same cycle.

In this manner, according to the testing device 10 in the present embodiment, although the timing in which the output of the output pattern from the device under test 100 is started is indefinite, it is possible to synchronize the expectation pattern and the output pattern adequately.

When the vector-generation controlling unit 116 carries out the PKTEND command, the timing adjusting unit 640 performs a setting in which the output pattern is not delayed by the expectation comparing unit 630. In this way, the expectation comparing unit 630 outputs the input output pattern sequence to the expectation comparing unit 630 without delaying the output pattern sequence. More specifically, after executing the PKTEND command, the sequential pattern generating unit 146 reads the expectation pattern sequences $ED_m$, $ED_{m+1}$, and $ED_{m+2}$. Here, since the comparing stage is executed after the command executing stage, the timing in which the expectation pattern sequence is input into the comparing stage is later than the timing in which the corresponding command is executed in the command executing stage.

In the comparing stage, the comparator 180 sequentially acquires the output pattern sequences $D_m$, $D_{m+1}$, and $D_{m+2}$ to supply them to the hunting and comparing unit 148. The alignment unit 620 outputs the output pattern sequences to the expectation comparing unit 630 without delaying them. As a result, the expectation comparing unit 630 compares the output pattern $D_{m+1}$ and the expectation pattern $Ed_m$ to write the comparison result $R_m$ in the fail memory.

As described above, when the PKTEND command has been executed, the timing adjusting unit 640 returns the delay amount set in the alignment unit 620 to the delay amount before detecting the header pattern. As a result, the timing adjusting unit 640 can input the expectation pattern corresponding to any command and the output pattern acquired from the device under test 100 during executing the command into the expectation comparing unit 630 in the same cycle. In this way, it is possible to control whether the expectation pattern and the output pattern are synchronized with respect to only a part of the test of the device under test 100.

EXAMPLE 3

Figure 10:
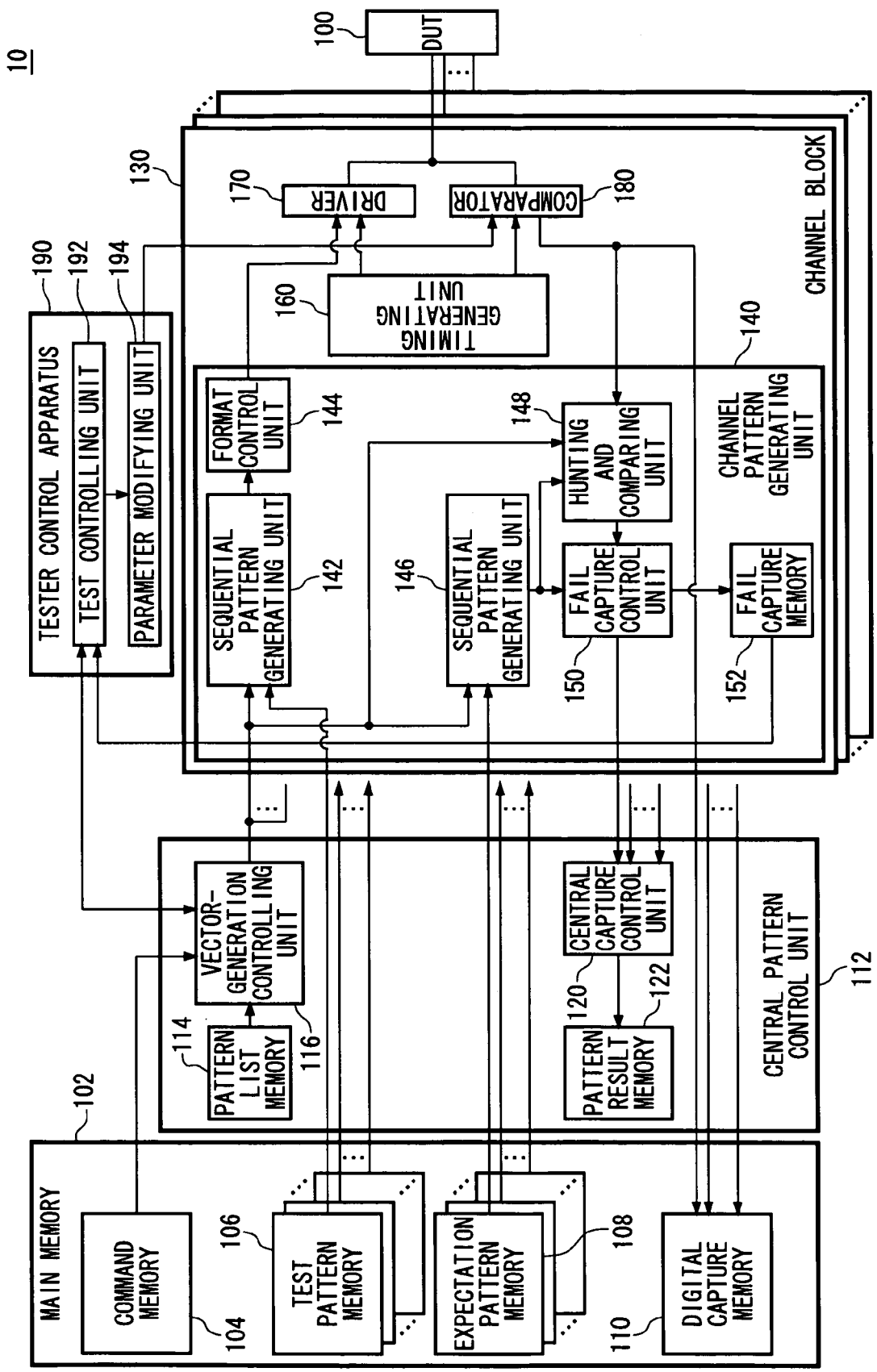
FIG. 10 shows a configuration of the testing device according to Example 3.

FIG. 10 shows a configuration of the testing device 10 according to Example 3. The testing device 10 according to the present example may not include the default pattern memory 118 in the testing device 10 shown in FIG. 1. Since the components of FIG. 10 having the same reference numbers as those of FIG. 1 have the generally same functions or configurations as those of FIG. 1, their descriptions will be omitted except for the following difference. Moreover, since the channel blocks 130a, 130b, . . . shown in FIG. 1 have the generally same functions as one another in the present example, these blocks are generally referred to as a channel block 130.

Figure 11:
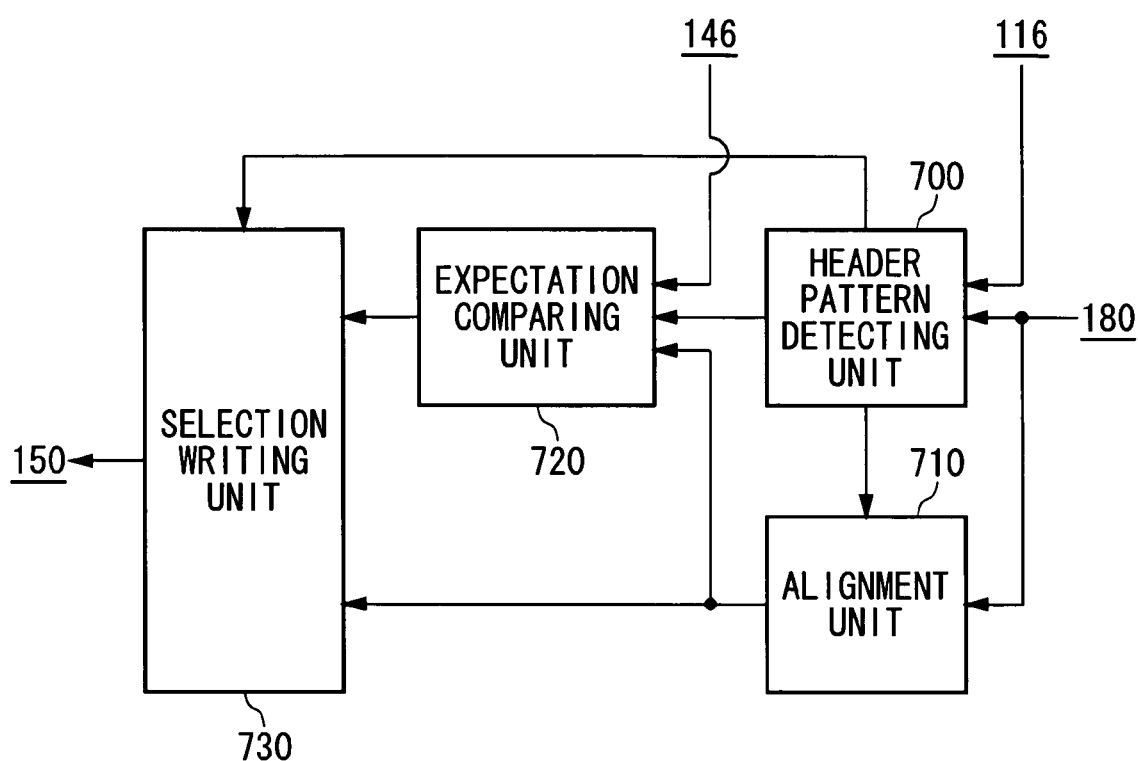
FIG. 11 shows a configuration of the hunting and comparing unit according to Example 3.

FIG. 11 shows a configuration of the hunting and comparing unit 148 according to Example 3. The hunting and comparing unit 148 has a header pattern detecting unit 700, an alignment unit 710, an expectation comparing unit 720, and a selection writing unit 730. The header pattern detecting unit 700 inputs an output pattern sequence output from the device under test 100 from the comparator 180. Then, the header pattern detecting unit 700 decides whether a detection starting command instructing a detection start of the output pattern sequence identical with the header pattern sequence has been detected based on a signal received from the vector-generation controlling unit 116. When the detection starting command has been executed, the header pattern detecting unit 700 detects whether the output pattern sequence identical with a predetermined header pattern sequence is output from the device under test 100.

When the header pattern sequence has been detected, the header pattern detecting unit 700 sets a parameter regulating the output timing of the output pattern sequence in the alignment unit 710 based on the elapsed time from the start of the detection of the header pattern sequence to the detection of the header pattern sequence. For example, the header pattern detecting unit 700 may set a delay amount delaying the output pattern sequence in the alignment unit 710. It is possible to synchronize the output pattern sequence and the expectation pattern sequence with each other by setting this delay amount adequately.

The alignment unit 710 inputs the output pattern sequence output from the device under test 100 via the comparator 180. Then, the alignment unit 710 delays the input output pattern sequence by a delay amount set by the header pattern detecting unit 700, to sent it to the expectation comparing unit 720 and the selection writing unit 730. When the output pattern sequence identical with the header pattern sequence has been detected, the expectation comparing unit 720 compares the output pattern sequence output from the device under test 100 following the output pattern sequence identical with the header pattern sequence with the expectation pattern sequence. Here, the output pattern sequence following the output pattern sequence identical with the header pattern sequence includes an output pattern output after outputting another pattern after the output pattern sequence identical with the header pattern sequence has been output as well as an output pattern output following the output pattern sequence identical with the header pattern sequence.

When the output pattern sequence identical with the header pattern sequence has been detected, the selection writing unit 730 sends the comparison result input from the expectation comparing unit 720 to the fail capture control unit 150. In this way, when the output pattern sequence identical with the header pattern sequence has been detected, the selection writing unit 730 can store the comparison result by the expectation comparing unit 720 on the fail capture memory 152.

On the other hand, when the output pattern sequence identical with the header pattern sequence is not detected, the selection writing unit 730 sends the output pattern input from the alignment unit 710 to the fail capture control unit 150. In this way, when the output pattern sequence identical with the header pattern sequence has not been detected, the selection writing unit 730 can store the output pattern sequence from the device under test 100 on the fail capture memory 152.

Figure 12:
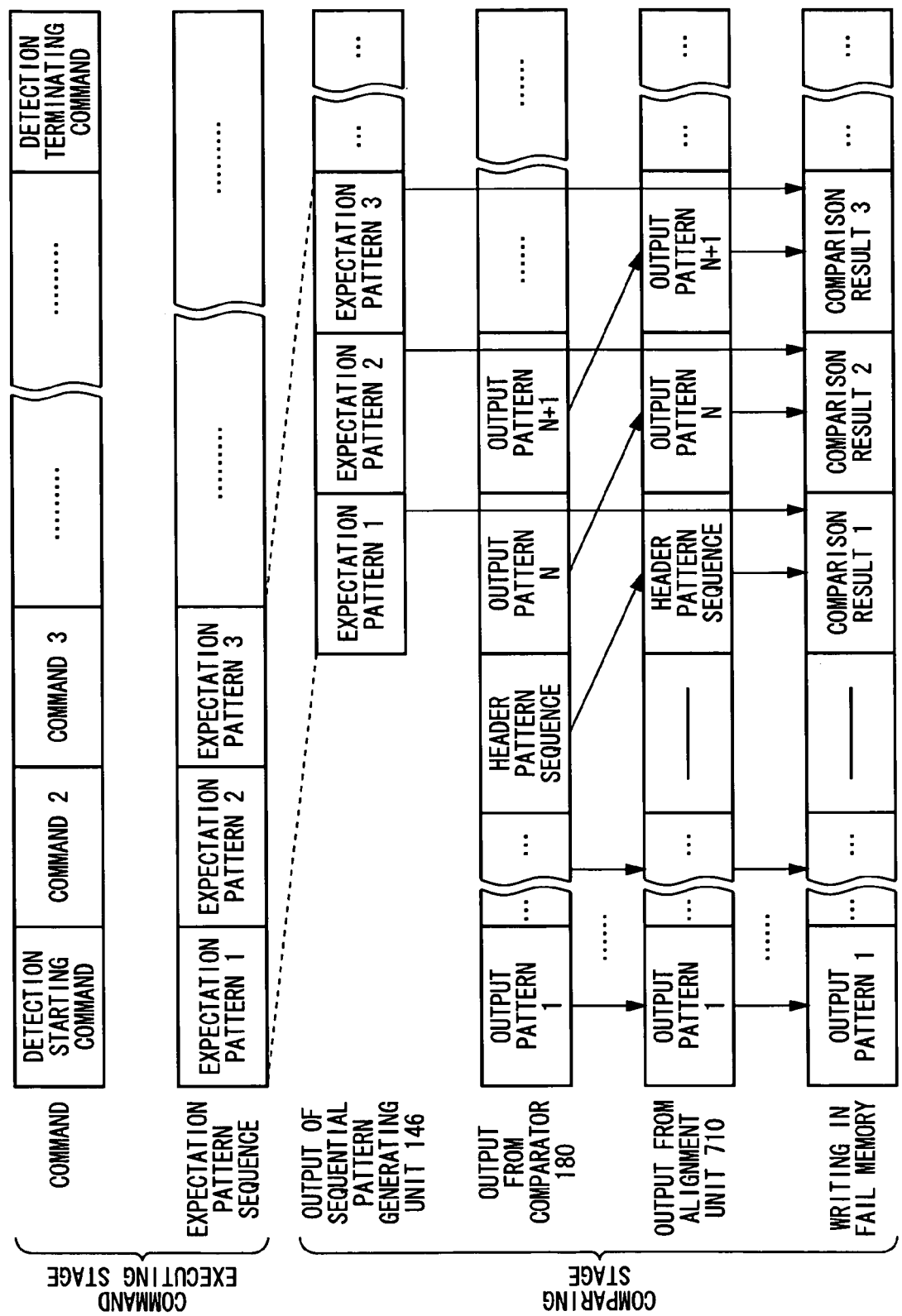
FIG. 12 shows the timing of a process in which an expectation pattern sequence and an output pattern sequence are compared according to Example 3.

FIG. 12 shows the timing of the process in which the header pattern sequence is detected by the hunting and comparing unit 148 according to Example 3. The vector-generation controlling unit 116 carries out each of a plurality of commands by means of a pipeline consisting of a plurality of stages including a command executing stage and a comparing stage. More specifically, in the command executing stage, the vector-generation controlling unit 116 sequentially executes the plurality of commands including a detection starting command instructing a detection start of the header pattern sequence every command cycle. For example, the vector-generation controlling unit 116 sequentially executes the detection starting command, a command 2, and a command 3 in turn, and executes a detection terminating command finally.

Then, the sequential pattern generating unit 146 sequentially reads the expectation pattern respectively corresponding to the plurality of commands from the expectation pattern memory 108. For example, the sequential pattern generating unit 146 sequentially reads an expectation pattern 1 corresponding to the detection starting command, an expectation pattern 2 corresponding to the command 2, and an expectation pattern 3 corresponding to the command 3. Here, since the comparing stage is executed after the command executing stage, the timing in which the expectation pattern sequence is referred in the comparing stage is later than the timing in which the corresponding command is executed in the command executing stage.

In the comparing stage, the comparator 180 acquires the output pattern output from the terminal of the DUT 100 to supply it to the hunting and comparing unit 148. For example, the hunting and comparing unit 148 acquires the output pattern 1, and sequentially acquires the header pattern sequence, the output pattern N, and the output pattern N+1 after omitting a part.

Since the alignment unit 710 does not set the delay amount delaying the output pattern sequence between the execution of the detection starting command and the detection of the header pattern sequence, the alignment unit 710 outputs the acquired output pattern sequence to the selection writing unit 730 without delaying the output pattern sequence. In this way, the selection writing unit 730 instructs the fail capture control unit 150 to write the output pattern sequence in the fail capture memory 152. In this manner, when the detection starting command has been executed, selection writing unit 730 starts an output pattern writing process sequentially writing the output pattern output from the device under test 100 in the fail capture memory 152.

Here, preferably, when the output pattern sequence identical with the header pattern sequence is not detected, the selection writing unit 730 stores the only output pattern sequence output from the device under test 100 on the fail capture memory 152 until the elapse of the number of predetermined command cycles after executing the detection starting command. In other words, the selection writing unit 730 does not store the output pattern sequence output after the number of command cycles on the fail capture memory 152. In this way, it is possible to effectively hold the only patterns useful for unfolding the cause by which the header pattern sequence is not detected. Alternatively, when the output pattern sequence identical with the header pattern sequence is not detected, the selection writing unit 730 may continuously store all the output pattern sequences, which are output between the execution of the detection starting command and the execution of the detection terminating command, on the fail capture memory 152.

On the other hand, when the output pattern sequence identical with the header pattern sequence has been detected, the header pattern detecting unit 700 sets a predetermined delay amount in the alignment unit 710 in order to synchronize the timings of a read-out of the expectation pattern and the output pattern with each other. As a result, the alignment unit 710 delays the output pattern sequence from the device under test 100 following the header pattern sequence, to synchronize the output pattern sequence with the output timing of the expectation pattern sequence.

In this way, the expectation comparing unit 720 compares the output pattern sequence output from the device under test following the output pattern sequence identical with the header pattern sequence with the expectation pattern sequence. In this case, the selection writing unit 730 instructs the fail capture control unit 150 to store the comparison result by the expectation comparing unit 720 on the fail capture memory 152. In this manner, when the output pattern sequence identical with the header pattern sequence has been detected, the selection writing unit 730 stops the output pattern writing process and starts a process sequentially storing the comparison result by the expectation comparing unit 720 on the fail capture memory 152.

In addition, although the header pattern sequence has been detected, the fail capture memory 152 may continue to hold the output pattern sequence output before the detection without erasing it, or may overwrite the output pattern sequence output before the detection by the comparison result.

As described above, according to FIG. 12, the testing device 10 writes the output pattern sequence in the fail capture memory 152 until the header pattern sequence is detected, and also writes the comparison result between the output pattern sequence and the expectation pattern sequence on the fail capture memory 152 when the header pattern sequence has been detected. In this way, when the header pattern is not detected, it is possible to easily analyze the cause. Moreover, it is possible to effectively utilize memory capacity of the fail capture memory 152 when the header pattern sequence has been detected.

EXAMPLE 4

Figure 13:
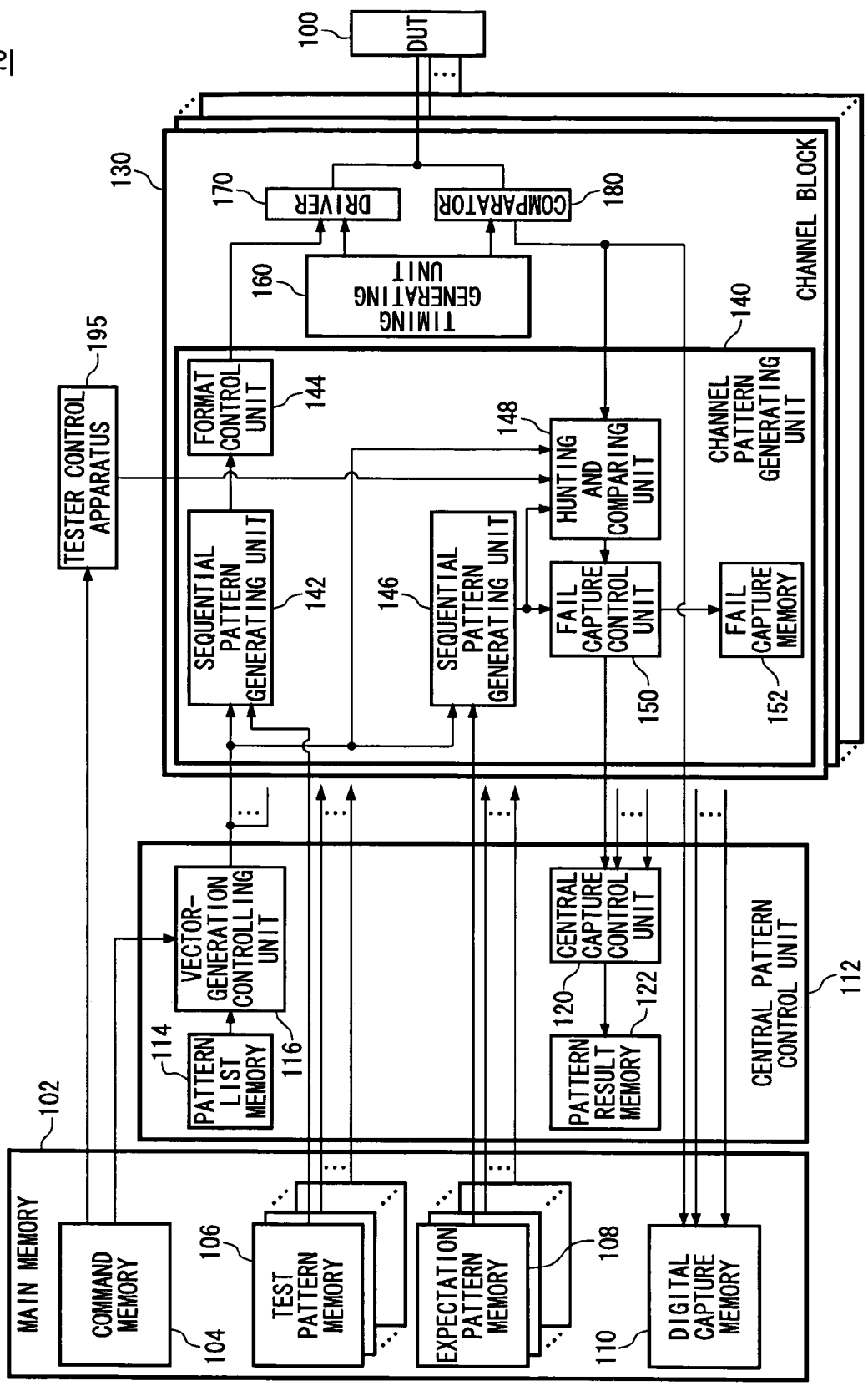
FIG. 13 shows a configuration of the testing device according to Example 4.

FIG. 13 shows a configuration of the testing device 10 according to Example 4. The testing device 10 according to the present example includes a tester control device 190 in place of the tester control device 195 in the testing device 10 shown in FIG. 1. Moreover, the testing device 10 may not include the default pattern memory 118. Since the components of FIG. 13 having the same reference numbers as those of FIG. 1 have the generally same functions or configurations as those of FIG. 1, their descriptions will be omitted except for the following difference. Moreover, since the channel blocks 130a, 130b, . . . shown in FIG. 1 have the generally same functions as one another in the present example, these blocks are generally referred to as a channel block 130.

Figure 14:
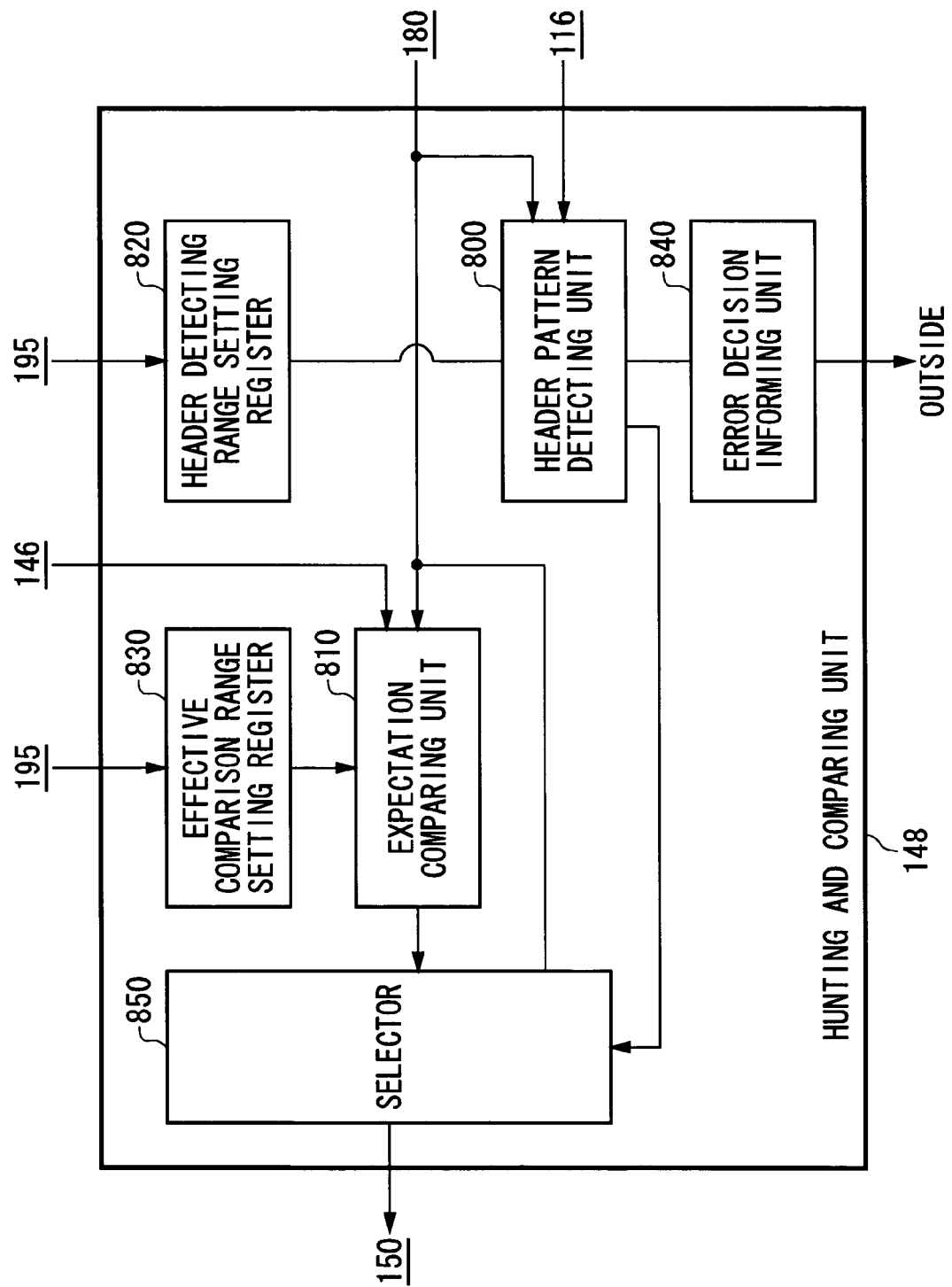
FIG. 14 shows a configuration of the hunting and comparing unit according to Example 4.

FIG. 14 shows a configuration of the hunting and comparing unit 148 according to Example 4. The hunting and comparing unit 148 has a header pattern detecting unit 800, an expectation comparing unit 810, a header detecting range setting register 820, an effective comparison range setting register 830, an error decision informing unit 840, and a selector 850. The header pattern detecting unit 800 decides whether a detection starting command has been executed when a command executed by the vector-generation controlling unit 116 is within an effective range validating the detection of the output pattern sequence identical with the header pattern sequence, which is set in the header detecting range setting register 820. Then, when the detection starting command has been executed, the header pattern detecting unit 800 acquires the output pattern sequence output from the device under test 100 via the comparator 180, and detects whether the output pattern sequence identical with the header pattern sequence is output from the device under test 100.

The expectation comparing unit 810 acquires the output pattern sequence output from the device under test 100 via the comparator 180, and acquires the expectation pattern sequence from the sequential pattern generating unit 146. Then, when the output pattern sequence identical with the header pattern sequence has been detected, the expectation comparing unit 810 compares the output pattern sequence output from the device under test 100 following the output pattern sequence identical with the header pattern sequence with the expectation pattern sequence. In this case, the expectation comparing unit 810 may compare the expectation pattern with the output pattern, on condition that an expectation pattern of a comparison object corresponds to either command within the effective range validating the comparison between the expectation pattern sequence and the output pattern sequence, which is set in the effective comparison range setting register 830.

The header detecting range setting register 820 stores a start address that is an address of a command at a start position of the effective range validating the detection of the output pattern sequence identical with the header pattern sequence and a termination address that is an address of a command terminating the effective range, among a plurality of commands carried out by the vector-generation controlling unit 116. This effective range is referred to as a hunting window. For example, the header detecting range setting register 820 may receive the setting of these addresses by the tester control device 195.

The effective comparison range setting register 830 stores a start address of a command corresponding to the expectation pattern validating the comparison with the output pattern and a termination address of a command corresponding to the expectation pattern validating the comparison with the output pattern, among a plurality of commands carried out by the vector-generation controlling unit 116. This range from the start address to the termination address is referred to as a comparison window. For example, the effective comparison range setting register 830 may receive the setting of these addresses by the tester control device 195.

In addition, when the plurality of expectation patterns corresponds to the same command every terminal in the in expectation pattern memory 108, the effective comparison range setting register 830 may further store a parameter showing which of the expectation patterns is used as a start point of the comparison window. Similarly, the effective comparison range setting register 830 may further store a parameter showing which of the expectation patterns is used as a termination point of the comparison window. In this way, it is possible to finely designate a range of the patterns corresponding to the comparison window. Moreover, alternatively, the effective comparison range setting register 830 may store the number of command cycles from the start of test to the start of comparison window and the number of command cycles from the start of test to the termination of comparison window, as the parameter showing the comparison window. In this way, since a method of designating the comparison window can use various methods, it is possible to swiftly and appropriately analyze various failures.

The error decision informing unit 840 informs the user of an error showing the failure of the detection of the header pattern sequence on condition that the commands from the detection starting command to the detection terminating command are within the hunting window, when the output pattern sequence identical with the header pattern sequence is not detected, between the execution of the detection starting command and the execution of the detection terminating command terminating the detection of the header pattern sequence.

When the output pattern sequence identical with the header pattern sequence has been detected, the selector 850 selects the comparison result by the expectation comparing unit 810 to send it to the fail capture control unit 150, and stores it on the fail capture memory 152 by way of the fail capture control unit 150. On the other hand, when the output pattern sequence identical with the header pattern sequence has not been detected, the selector 850 selects the output pattern sequence acquired from the comparator 180 to send it to the fail capture control unit 150, and stores it on the fail capture memory 152 by way of the fail capture control unit 150. In this way, it is possible to easily investigate the cause of the failure when the header pattern sequence is not detected.

Figure 15:
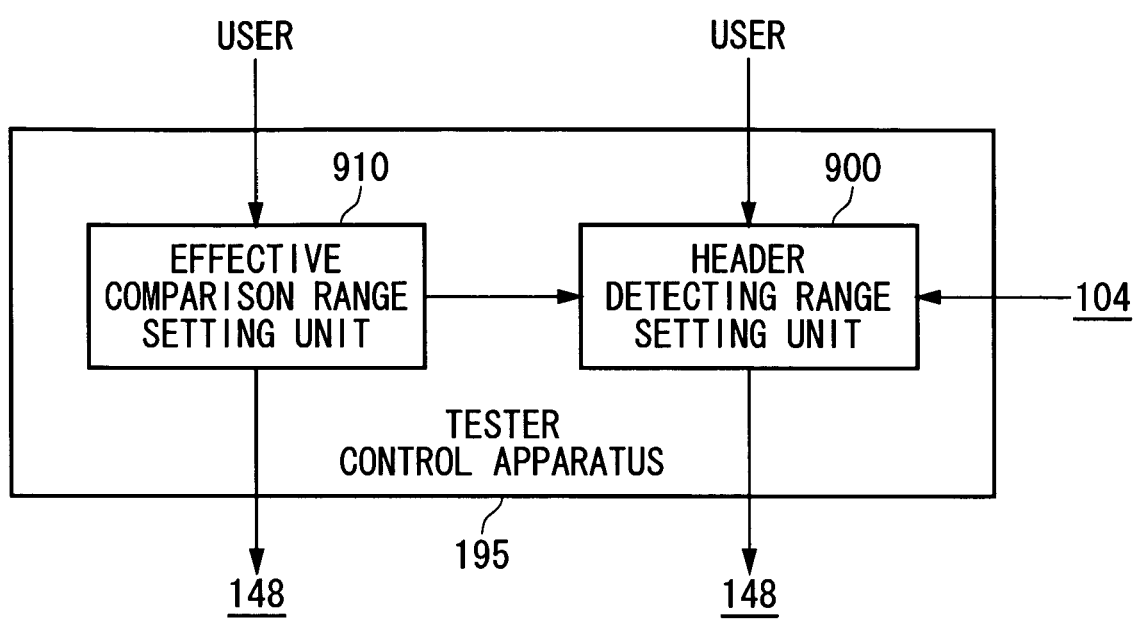
FIG. 15 shows a configuration of a tester control device according to Example 4.

FIG. 15 shows a configuration of the tester control device 195 according to Example 4. The tester control apparatus 195 has a header detecting range setting unit 900 and an effective comparison range setting unit 910. The header detecting range setting unit 900 sets a hunting window, i.e., an effective range validating the detection of the output pattern sequence identical with the header pattern sequence among a plurality of commands stored on the command memory 104. Specifically, the header detecting range setting unit 900 stores the values showing a start address and a termination address of the hunting window on the header detecting range setting register 820 according to the instruction of user.

Moreover, when a comparison window is set by the effective comparison range setting unit 910 with respect to at least one command between a detection starting command and a detection terminating command, the header detecting range setting unit 900 may validly set the detection of the header pattern sequence between the detection starting command and the detection terminating command.

Specifically, the header detecting range setting unit 900 may perform the following processes whenever the comparison window is set newly. At first, the header detecting range setting unit 900 detects all sets of the detection starting command and the detection terminating command by scanning the command memory 104. Next, the header detecting range setting unit 900 decides whether the comparison window has newly been set for at least one command from each of the detection starting commands to the corresponding detection terminating command. Then, the header detecting range setting unit 900 validates the detection of the header pattern sequence between the detection starting command for which the comparison window is newly set and the corresponding detection terminating command.

FIG. 16 is a view exemplary showing the hunting window according to Example 4. According to the present drawing, the output patterns output from the device under test 100 in the timing in which the commands are executed correspond to the plurality of commands that is read and sequentially executed by the vector-generation controlling unit 116. For example, the output data $D_0$ is output in the timing in which a PKTST command that is an example of the detection starting command is executed. Moreover, the output data $D_1$ is output in the timing in which an NOP command to be executed next to the PKTST command is executed.

After the plurality of commands following the NOP command is sequentially executed, the NOP command is further executed. In the timing in which the NOP command is executed, the output data $D_n$ is output. Next, a PKTEND command that is an example of the detection terminating command is executed. Here, a hunting window is not set for any command from the PKTST command to the PKTEND command. Therefore, when each command from the PKTST command to the PKTEND command is executed, the header pattern detecting unit 800 does not detect the header pattern sequence. Furthermore, when each command from the PKTST command to the PKTEND command is executed, the error decision informing unit 840 does not inform of an error showing the non-detection of the header pattern sequence even if the header pattern sequence is not detected.

The vector-generation controlling unit 116 sequentially executes other commands after executing the PKTEND command, and executes the PKTST command again. In the timing in which the PKTST command is executed, the output data $D_m$ is output from the device under test 100. Next, the NOP command is executed, and the output data $D_{m+1}$ is output in the timing in which the NOP command is executed. After the plurality of commands is sequentially executed following the NOP command, the NOP command is further executed. In the timing in which the NOP command is executed, the output data $D_l$ is output. Next, the PKTEND command is executed, the output data $D_{l+1}$ is output in the timing in which the PKTEND command is executed.

Here, HUNT_ST that is a parameter showing a start address of the hunting window shows an address of a command to be executed before the PKTST command. Then, HUNT_END that is a parameter showing a termination address of the hunting window shows an address of a command to be executed after the PKTEND command. In other words, both of the PKTST command and the PKTEND command are within the range of the hunting window. Therefore, when each command from the PKTST command to the PKTEND command is carried out, the header pattern detecting unit 800 detects the output pattern sequence identical with the header pattern sequence. Furthermore, when each command from the PKTST command to the PKTEND command is carried out, the error decision informing unit 840 informs of an error showing the non-detection of the header pattern sequence when the header pattern sequence is not detected.

In this manner, although the vector-generation controlling unit 116 executes a plurality of sets of the PKTST command and the PKTEND command, it is possible to independently set whether the header pattern sequence is detected for each set of the PKTST command and the PKTEND command by storing an appropriate value on the header detecting range setting register 820. In this way, it is possible to easily realize failure analysis of the device under test 100 without renewing the test program.

FIG. 17 is a view exemplary showing the comparison window according to Example 4. According to the present drawing, the output patterns output from the device under test 100 in the timing in which the commands are executed correspond to the plurality of commands that is read and sequentially executed by the vector-generation controlling unit 116. For example, the output data $D_0$ is output in the timing in which a PKTST command that is an example of the detection starting command is executed. Moreover, the output data $D_1$ is output in the timing in which an NOP command to be executed next to the PKTST command is executed. Since other commands and an association with output data are equal to those of FIG. 16, their descriptions will be omitted.

Here, a comparison window is not set for any command from the PKTST command that is firstly executed to the corresponding PKTEND command. Therefore, the header detecting range setting unit 900 invalidates the detection of the header pattern sequence between the PKTST command and the PKTEND command. On the other hand, the comparison window is set for commands between the PKTST command to be executed next and the corresponding PKTEND command. Specifically, CPEW_ST is a parameter showing a start address of the comparison window, and shows an address of a command to be executed after the PKTST command. Moreover, CPEW_END is a parameter showing a termination address of the comparison window, and shows an address of a command to be executed before the PKTEND command.

Therefore, when each command from the PKTST command to the PKTEND command is carried out, the header pattern detecting unit 800 detects the output pattern sequence identical with the header pattern sequence. Then, when the output pattern sequence identical with the header pattern sequence has not been detected, the error decision in forming unit 840 informs of an error showing the non-detection of the header pattern sequence. As a result, since the detection fail of the header pattern sequence is informed with respect to only the commands of the comparison object, it is possible to raise efficiency of failure analysis with the exception of information unnecessary for the failure analysis of the device under test 100.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to adequately test a margin of an output signal output from a device under test. Moreover, although the output timing of the output pattern sequence is indefinite, the output of the output pattern sequence can be synchronized and compared with the reading of the expectation pattern sequence, and when the header pattern showing the start of the test is not detected, the cause can easily be investigated. Moreover, it is possible to adequately set a range validating the detection of the header pattern sequence.

What is claimed is:

1. A testing device that tests a margin of an output signal output from an output terminal of a device under test by comparing the output signal with a predetermined pattern, comprising:
a first signal comparator operable to acquire a value of each of output patterns included in an output pattern sequence output from the output terminal of the device under test based on a result that is obtained by comparing a voltage of the output signal and a first predetermined threshold value voltage in a first predetermined strobe timing, in order to acquire a first output pattern sequence output from the output terminal;
a second signal comparator operable to acquire a value of each of output patterns included in an output pattern sequence output from the output terminal of the device under test based on a result that is obtained by comparing a voltage of the output signal and a second predetermined threshold value voltage in a second predetermined strobe timing, in order to acquire a second output pattern sequence output from the output terminal;
a header pattern sequence detecting unit operable to detect that the first output pattern sequence is identical with a predetermined header pattern sequence; and
an expectation comparing unit operable to output a comparison result between the second output pattern sequence acquired by said second signal comparator and an expectation pattern sequence of the second output pattern sequence when the header pattern sequence detecting unit detects that the first output pattern sequence is identical with the predetermined header pattern sequence.

2. The testing device as claimed in claim 1, further comprising a comparison result storing unit operable to store a comparison result between the second output pattern sequence and the expectation pattern sequence in association with the second strobe timing and the second threshold value voltage.

3. The testing device as claimed in claim 1, further comprising:
a test controlling unit operable to carry out more than once a test to cause the device under test to output an output pattern sequence identical with the header pattern sequence and an output pattern sequence identical with the expectation pattern sequence; and
a parameter modifying unit operable to modifying at least one parameter value of the second strobe timing and the second threshold value voltage in the second test into a value different from that of a parameter in the first test.

4. The testing device as claimed in claim 3, wherein said test controlling unit outputs the second strobe timing and a range of the second threshold value voltage in which the second output pattern sequence is identical with the expectation pattern sequence based on the comparison result output from said expectation comparing unit with respect to each of the plurality of tests.

5. The testing device as claimed in claim 1, wherein at least one of the first and second strobe timings and the first and second threshold value voltages are set to have values different from each other.

6. The testing device as claimed in claim 1, wherein said expectation comparing unit outputs a comparison result between the second output pattern sequence acquired after the first output pattern sequence is acquired and then a predetermined offset time elapses and the expectation pattern sequence when the first output pattern sequence is identical with the header pattern sequence.

7. The testing device as claimed in claim 1, wherein the first output pattern sequence to be identical with the header pattern sequence and the second output pattern sequence to be compared with the expectation pattern sequence are the same pattern sequences output from the output terminal of the device under test in the same timing.

8. A testing device that decides whether a device under test is defective or not based on a comparison result between an output pattern sequence sequentially output from a terminal of the device under test and an expectation pattern sequence to be compared with the output pattern sequence, comprising:
a sequence controlling unit operable to sequentially execute a plurality of commands included in a test program of the device under test and read an expectation pattern corresponding to each of the executed commands from a memory;
a header pattern detecting unit operable to detect whether an output pattern sequence identical with a predetermined header pattern sequence is output from the device under test when a detection starting command to indicate a detection start of the output pattern sequence identical with the header pattern sequence has been executed;
an expectation comparing unit operable to compare the output pattern sequence and the expectation pattern sequence; and
a timing adjusting unit operable to respectively synchronize and input expectation patterns and output patterns to be compared with the expectation patterns into said expectation comparing unit in the same cycle when an output pattern sequence identical with the header pattern sequence has been detected.

9. The testing device as claimed in claim 8, wherein
said sequence controlling unit respectively executes the commands by means of an instruction execution pipeline consisting of a plurality of stages having a comparing stage of comparing the output pattern with the expectation pattern, and
said timing adjusting unit performs an adjustment to input an output pattern to be compared with the expectation pattern into the comparing stage in the timing in which the expectation pattern is input into the comparing stage.

10. The testing device as claimed in claim 8, wherein said timing adjusting unit inputs an expectation pattern corresponding to one command and an output pattern acquired during executing the one command into said expectation comparing unit in the same cycle when a detection terminating command to indicate a detection termination of the header pattern sequence has been executed by said sequence controlling unit.

11. The testing device as claimed in claim 8, wherein
the testing device further comprises a header pattern storing unit operable to store the plurality of header pattern sequences,
said sequence controlling unit executes a command including an instruction selecting a header pattern sequence of a detection object from said header pattern storing unit as the detection starting command, and
said header pattern detecting unit detects whether an output pattern sequence identical with a header pattern sequence selected based on the detection starting command is output from the device under test.

12. The testing device as claimed in claim 8, further comprising an error informing unit operable to inform of the failure of detection of the header pattern sequence when an output pattern sequence identical with the header pattern sequence has not been detected within a predetermined period after starting the detection of the header pattern sequence.

13. A testing device that decides whether a device under test is defective or not based on a comparison result between an output pattern sequence sequentially output from a terminal of the device under test and an expectation pattern sequence to be compared with the output pattern sequence, comprising:
a header pattern detecting unit operable to detect whether an output pattern sequence identical with a predetermined header pattern sequence is output from the device under test;
an expectation comparing unit operable to compare an output pattern sequence output from the device under test following the output pattern sequence identical with the header pattern sequence with the expectation pattern sequence when the output pattern sequence identical with the header pattern sequence has been detected; and
a selection writing unit operable to store the comparison result by said expectation comparing unit on a fail memory when an output pattern sequence identical with the header pattern sequence has been detected and store an output pattern sequence of the device under test on the fail memory when an output pattern sequence identical with the header pattern sequence has not been detected.

14. The testing device as claimed in claim 13, wherein
the testing device further comprises a command executing unit operable to sequentially execute a plurality of commands including a detection starting command to indicate a detection start of the header pattern sequence every instruction cycle, and
said selection writing unit starts an output pattern writing process sequentially writing an output pattern output from the device under test on the fail memory when the detection starting command has been executed and starts a process stopping the output pattern writing process and sequentially storing the comparison result by said expectation comparing unit on the fail memory when an output pattern sequence identical with the header pattern sequence has been detected.

15. The testing device as claimed in claim 14, wherein said selection writing unit stores the output pattern sequence output from the device under test, from the execution of the detection starting command to the elapse of a predetermined command cycles, on the fail memory and does not store the output pattern sequence output after the predetermined command cycles has elapsed on the fail memory, when the output pattern sequence identical with the header pattern sequence is not detected.

16. A testing device that decides whether a device under test is defective or not based on a comparison result between an output pattern sequence sequentially output from a terminal of the device under test and an expectation pattern sequence to be compared with the output pattern sequence, comprising:
- a sequence controlling unit operable to sequentially execute a plurality of commands included in a test program of the device under test and read an expectation pattern corresponding to each of the executed commands from a memory;
- a header pattern detecting unit operable to detect whether an output pattern sequence identical with a predetermined header pattern sequence is output from the device under test when a detection starting command to indicate a detection start of the output pattern sequence identical with the header pattern sequence has been executed;
- an expectation comparing unit operable to compare an output pattern sequence output from the device under test following the output pattern sequence identical with the header pattern sequence with the expectation pattern sequence when the output pattern sequence identical with the header pattern sequence has been detected;
- a header detecting range setting unit operable to set an effective range of the commands validating the detection of output pattern sequence identical with the header pattern sequence, among the plurality of commands; and
- an error decision informing unit operable to inform of an error to indicate the failure of detection of the header pattern sequence on condition that the commands between the detection starting command and the detection terminating command are within the effective range when an output pattern sequence identical with the header pattern sequence has not been detected between the execution of the detection starting command and the execution of the detection terminating command terminating the detection of the header pattern sequence.

17. The testing device as claimed in claim 16, wherein the testing device further comprises a header detecting range setting register operable to store a start address that is an address of the command of a start position of the effective range and a termination address that is an address of the command of a termination position of the effective range,
said header detecting range setting unit sets the effective range by storing a value on the header detecting range setting register, and
said error decision informing unit informs of an error to indicate the failure of detection of the header pattern sequence on condition that the detection starting command and the detection terminating command are executed, between the start address stored on said header detecting range setting register and the termination address stored on said header detecting range setting register.

18. The testing device as claimed in claim 16, wherein the testing device further comprises an effective comparison range setting unit operable to set a comparison window showing validity of the comparison between an expectation pattern and an output pattern corresponding to the one command in association with at least one command, and
said header detecting range setting unit validates the detection of header pattern sequence between the detection starting command and the detection terminating command when the comparison window is set corresponding to at least one command between the detection starting command and the detection terminating command.

19. A testing device that tests a margin of an output signal output from an output terminal of a device under test by comparing the output signal with a predetermined pattern, comprising:
- a test pattern outputting unit operable to output a test pattern sequence, by which a predetermined header pattern sequence is output from the output terminal of the device under test, to the device under test;
- a signal comparator operable to acquire a value of each of output patterns included in an output pattern sequence output from the output terminal of the device under test based on a result that is obtained by comparing a voltage of the output signal and a threshold value voltage in a predetermined strobe timing, in order to acquire the output pattern sequence output from the output terminal;
- a header pattern sequence detecting unit operable to detect that the first output pattern sequence acquired by said signal comparator is identical with the header pattern sequence; a delay time acquiring unit operable to acquire a delay time from the start of the output of the test pattern to the detection of the first output pattern sequence identical with the header pattern sequence;
- a parameter modifying unit operable to modify at least one parameter of the strobe timing and the threshold value voltage when the delay time is acquired; a test controlling unit operable to cause said test pattern outputting unit to output the test pattern sequence once more in a state where the parameter has been modified by said parameter modifying unit; and
- an expectation comparing unit operable to output a comparison result between a second output pattern sequence acquired by said signal comparator after the output of the test pattern sequence is started once more and then a predetermined offset time elapses from the elapsed point of the delay time and an expectation pattern sequence of the second output pattern sequence.

20. A testing method testing a margin of an output signal output from an output terminal of a device under test by comparing the output signal with a predetermined pattern by means of a testing device, comprising:
- a first signal comparing step of acquiring a value of each of output patterns included in an output pattern sequence output from the output terminal of the device under test based on a result that is obtained by comparing a voltage of the output signal and a first predetermined threshold value voltage in a first predetermined strobe timing, in order to acquire a first output pattern sequence output from the output terminal;
- a second signal comparing step of acquiring a value of each of output patterns included in an output pattern sequence output from the output terminal of the device under test based on a result that is obtained by comparing a voltage of the output signal and a second predetermined threshold value voltage in a second predetermined strobe timing, in order to acquire a second output pattern sequence output from the output terminal;
- a header pattern sequence detecting step of detecting that the first output pattern sequence is identical with a predetermined header pattern sequence; and
- an expectation comparing step of outputting a comparison result between the second output pattern sequence acquired in said second signal comparing step and an expectation pattern sequence of the second output pattern sequence when detecting a correspondence between the first output pattern sequence and the header pattern sequence.

21. A testing method for testing a margin of an output signal output from an output terminal of a device under test by comparing the output signal with a predetermined pattern by means of a testing device, comprising:

a test pattern outputting step of outputting a test pattern sequence, by which a predetermined header pattern sequence is output from the output terminal of the device under test, to the device under test;

a signal comparing step of acquiring a value of each of output patterns included in an output pattern sequence output from the output terminal of the device under test based on a result that is obtained by comparing a voltage of the output signal and a threshold value voltage in a predetermined strobe timing, in order to acquire the output pattern sequence output from the output terminal;

a header pattern sequence detecting step of detecting that the first output pattern sequence acquired in said signal comparing step is identical with the header pattern sequence;

a delay time acquiring step of acquiring a delay time from the start of the output of the test pattern to the detection of the first output pattern sequence identical with the header pattern sequence;

a parameter modifying step of modifying at least one parameter of the strobe timing and the threshold value voltage when the delay time is acquired;

a test controlling step of causing said test pattern outputting step to output the test pattern sequence once more in a state where the parameter has been modified in said parameter modifying step;

an expectation comparing step of outputting a comparison result between a second output pattern sequence acquired in said signal comparing step after the output of the test pattern sequence is started once more and then a predetermined offset time elapses from the elapsed point of the delay time and an expectation pattern sequence of the second output pattern sequence; and an outputting step for outputting a signal to a user indicating whether the device under test is defective or not.

22. A testing method deciding whether a device under test is defective or not based on a comparison result between an output pattern sequence sequentially output from a terminal of the device under test and an expectation pattern sequence to be compared with the output pattern sequence, comprising:

a sequence controlling step of sequentially executing a plurality of commands included in a test program of the device under test and reading an expectation pattern corresponding to each of the executed commands from a memory;

a header pattern detecting step of detecting whether an output pattern sequence identical with a predetermined header pattern sequence is output from the device under test when a detection starting command to indicate a detection start of the output pattern sequence identical with the header pattern sequence has been executed;

an expectation comparing step of comparing the output pattern sequence and the expectation pattern sequence;

a timing adjusting step of respectively synchronizing and comparing expectation patterns and output patterns to be compared with the expectation patterns in the same cycle in said expectation comparing step when an output pattern sequence identical with the header pattern sequence has been detected; and an outputting step for outputting a signal to a user indicating whether the device under test is defective or not.

23. A testing method deciding whether a device under test is defective or not based on a comparison result between an output pattern sequence sequentially output from a terminal of the device under test and an expectation pattern sequence to be compared with the output pattern sequence, comprising:

a header pattern detecting step of detecting whether an output pattern sequence identical with a predetermined header pattern sequence is output from the device under test;

an expectation comparing step of comparing an output pattern sequence output from the device under test following the output pattern sequence identical with the header pattern sequence with the expectation pattern sequence when the output pattern sequence identical with the header pattern sequence has been detected; and a selection writing step of storing the comparison result in said expectation comparing step on a fail memory when an output pattern sequence identical with the header pattern sequence has been detected and storing an output pattern sequence of the device under test on the fail memory when an output pattern sequence identical with the header pattern sequence has not been detected.

24. A testing method deciding whether a device under test is defective or not based on a comparison result between an output pattern sequence sequentially output from a terminal of the device under test and an expectation pattern sequence to be compared with the output pattern sequence, comprising:

a sequence controlling step of sequentially executing a plurality of commands included in a test program of the device under test and reading an expectation pattern corresponding to each of the executed commands from a memory;

a header pattern detecting step of detecting whether an output pattern sequence identical with a predetermined header pattern sequence is output from the device under test when a detection starting command to indicate a detection start of the output pattern sequence identical with the header pattern sequence has been executed;

an expectation comparing step of comparing an output pattern sequence output from the device under test following the output pattern sequence identical with the header pattern sequence with the expectation pattern sequence when the output pattern sequence identical with the header pattern sequence has been detected;

a header detecting range setting step of setting an effective range of the commands validating the detection of output pattern sequence identical with the header pattern sequence, among the plurality of commands;

an error decision informing step of informing of an error to indicate the failure of detection of the header pattern sequence on condition that the commands between the detection starting command and the detection terminating command are within the effective range when an output pattern sequence identical with the header pattern sequence has not been detected between the execution of the detection starting command and the execution of the detection terminating command terminating the detection of the header pattern sequence; and an outputting step for outputting a signal to a user indicating whether the device under test is defective or not.

* * * * *